(12) United States Patent
Larson, III et al.

(10) Patent No.: US 7,391,285 B2
(45) Date of Patent: Jun. 24, 2008

(54) FILM ACOUSTICALLY-COUPLED TRANSFORMER

(75) Inventors: John D. Larson, III, Palo Alto, CA (US); Richard C. Ruby, Menlo Park, CA (US); Stephen L. Ellis, Pleasanton, CA (US)

(73) Assignee: Avago Technologies Wireless IP Pte Ltd, Singapore (SG)

( * ) Notice: Subject to any disclaimer, the term of this patent is extended or adjusted under 35 U.S.C. 154(b) by 20 days.

(21) Appl. No.: 10/965,637

(22) Filed: Oct. 13, 2004

(65) Prior Publication Data

US 2005/0093655 A1    May 5, 2005

Related U.S. Application Data

(63) Continuation-in-part of application No. 10/699,289, filed on Oct. 30, 2003, now Pat. No. 7,019,605, which is a continuation-in-part of application No. 10/699,481, filed on Oct. 30, 2003, now Pat. No. 6,946,928.

(51) Int. Cl.
    *H03H 9/54* (2006.01)
(52) U.S. Cl. .......................................... 333/189; 333/32
(58) Field of Classification Search ......... 333/187–189, 333/133
    See application file for complete search history.

(56) References Cited

U.S. PATENT DOCUMENTS

| 3,174,122 A | 3/1965 | Fowler et al. |
| 3,189,851 A | 6/1965 | Fowler |
| 3,321,648 A | 5/1967 | Kolm |
| 3,422,371 A | 1/1969 | Poirier et al. |
| 3,568,108 A | 3/1971 | Poirier et al. |
| 3,582,839 A | 6/1971 | Pim et al. |
| 3,590,287 A | 6/1971 | Berlincourt et al. |
| 3,607,761 A | 9/1971 | Feighner et al. |
| 3,610,969 A | 10/1971 | Clawson et al. |

(Continued)

FOREIGN PATENT DOCUMENTS

DE    101 60 617 A1 *    6/2003

(Continued)

OTHER PUBLICATIONS

Lakin, K.M., "Bulk Acoustic Wave Coupled Resonator Filters", IEEE International Frequency Control Symposium and PDA Exhibition, 2002, pp. 8-14, May 29-31, 2002.

(Continued)

*Primary Examiner*—Barbara Summons

(57) ABSTRACT

One embodiment of the film acoustically-coupled transformer (FACT) includes a decoupled stacked bulk acoustic resonator (DSBAR) having a lower film bulk acoustic resonator (FBAR) an upper FBAR stacked on the lower FBAR, and, between the FBARs, an acoustic decoupler comprising a layer of acoustic decoupling material. Each FBAR has opposed planar electrodes with a piezoelectric element between them. The FACT additionally has first terminals electrically connected to the electrodes of one FBAR and second terminals electrically connected to the electrodes of the other FBAR. Another embodiment has decoupled stacked bulk acoustic resonators (DSBARs), each as described above, a first electrical circuit interconnecting the lower FBARs, and a second electrical circuit interconnecting the upper FBARs. The FACT provides impedance transformation, can linking single-ended circuitry with balanced circuitry or vice versa and electrically isolates primary and secondary. Some embodiments are additionally electrically balanced.

23 Claims, 10 Drawing Sheets

U.S. PATENT DOCUMENTS

| | | | |
|---|---|---|---|
| 3,826,931 A | 7/1974 | Hammond | |
| 3,845,402 A | 10/1974 | Nupp | |
| 4,084,217 A | 4/1978 | Brandis et al. | |
| 4,172,277 A | 10/1979 | Pinson | |
| 4,272,742 A | 6/1981 | Lewis | |
| 4,281,299 A | 7/1981 | Newbold | |
| 4,320,365 A | 3/1982 | Black et al. | |
| 4,355,408 A | 10/1982 | Scarrott | |
| 4,456,850 A | 6/1984 | Inoue et al. | |
| 4,529,904 A | 7/1985 | Hattersley | |
| 4,625,138 A | 11/1986 | Ballato | |
| 4,719,383 A | 1/1988 | Wang et al. | |
| 4,798,990 A | 1/1989 | Henoch | |
| 4,836,882 A | 6/1989 | Ballato | |
| 4,841,429 A | 6/1989 | McClanahan et al. | |
| 4,906,840 A | 3/1990 | Zdeblick et al. | |
| 5,048,036 A | 9/1991 | Scifres et al. | |
| 5,048,038 A | 9/1991 | Brennan et al. | |
| 5,118,982 A | 6/1992 | Inoue et al. | |
| 5,129,132 A | 7/1992 | Zdeblick et al. | |
| 5,162,691 A | 11/1992 | Mariani et al. | |
| 5,241,209 A | 8/1993 | Sasaki | |
| 5,241,456 A | 8/1993 | Marcinkiewicz et al. | |
| 5,294,898 A | 3/1994 | Dworsky et al. | |
| 5,382,930 A | 1/1995 | Stokes et al. | |
| 5,384,808 A | 1/1995 | Van Brunt et al. | |
| 5,448,014 A | 9/1995 | Kong et al. | |
| 5,465,725 A | 11/1995 | Seyed-Bolorforosh | |
| 5,587,620 A | 12/1996 | Ruby et al. | 310/346 |
| 5,589,858 A | 12/1996 | Kadowaki et al. | |
| 5,594,705 A | 1/1997 | Connor et al. | |
| 5,671,242 A | 9/1997 | Takiguchi et al. | |
| 5,692,279 A | 12/1997 | Mang et al. | |
| 5,714,917 A | 2/1998 | Ella | |
| 5,853,601 A | 12/1998 | Krishaswamy et al. | |
| 5,864,261 A | 1/1999 | Weber | |
| 5,872,493 A | 2/1999 | Ella | |
| 5,873,153 A | 2/1999 | Ruby et al. | |
| 5,873,154 A | 2/1999 | Ylilammi et al. | 29/25.35 |
| 5,910,756 A | 6/1999 | Ella | |
| 5,936,150 A | 8/1999 | Korbin et al. | |
| 5,953,479 A | 9/1999 | Zhou et al. | |
| 5,982,297 A | 11/1999 | Welle | |
| 6,040,962 A | 3/2000 | Kanazawa | |
| 6,060,818 A | 5/2000 | Ruby et al. | |
| 6,087,198 A | 7/2000 | Panasik | |
| 6,107,721 A | 8/2000 | Lakin | 310/321 |
| 6,111,480 A | 8/2000 | Iyama et al. | |
| 6,124,756 A | 9/2000 | Yaklin et al. | |
| 6,150,703 A | 11/2000 | Cushman et al. | |
| 6,187,513 B1 | 2/2001 | Katakura | |
| 6,215,375 B1 | 4/2001 | Larson, III et al. | 333/187 |
| 6,228,675 B1 | 5/2001 | Ruby et al. | |
| 6,229,247 B1 | 5/2001 | Bishop | |
| 6,252,229 B1 | 6/2001 | Hays et al. | |
| 6,262,600 B1 | 7/2001 | Haigh et al. | |
| 6,262,637 B1 | 7/2001 | Bradley et al. | 333/133 |
| 6,265,246 B1 | 7/2001 | Ruby et al. | |
| 6,278,342 B1* | 8/2001 | Ella | 333/189 |
| 6,292,336 B1 | 9/2001 | Horng | |
| 6,307,447 B1 | 10/2001 | Barber et al. | |
| 6,376,280 B1 | 4/2002 | Ruby et al. | |
| 6,377,137 B1 | 4/2002 | Ruby | |
| 6,384,697 B1 | 5/2002 | Ruby | |
| 6,407,649 B1 | 6/2002 | Tikka et al. | |
| 6,414,569 B1 | 7/2002 | Nakafuku | |
| 6,420,820 B1 | 7/2002 | Larson, III | |
| 6,424,237 B1 | 7/2002 | Ruby et al. | |
| 6,429,511 B2 | 8/2002 | Ruby et al. | |
| 6,434,030 B1 | 8/2002 | Rehm et al. | |
| 6,437,482 B1 | 8/2002 | Shibata | |
| 6,441,539 B1 | 8/2002 | Kitamura et al. | |
| 6,462,631 B2 | 10/2002 | Bradley et al. | |
| 6,466,105 B1* | 10/2002 | Lobl et al. | 333/187 |
| 6,466,418 B1 | 10/2002 | Horng | |
| 6,469,597 B2 | 10/2002 | Ruby et al. | |
| 6,472,954 B1 | 10/2002 | Ruby et al. | |
| 6,476,536 B1 | 11/2002 | Pensala | |
| 6,479,320 B1 | 11/2002 | Gooch | |
| 6,483,229 B2 | 11/2002 | Larson, III et al. | |
| 6,486,751 B1 | 11/2002 | Barber et al. | |
| 6,489,688 B1 | 12/2002 | Baumann et al. | |
| 6,492,883 B2 | 12/2002 | Liang et al. | |
| 6,507,983 B1 | 1/2003 | Ruby et al. | |
| 6,515,558 B1 | 2/2003 | Ylilammi | |
| 6,518,860 B2 | 2/2003 | Ella et al. | |
| 6,525,996 B1 | 2/2003 | Miyazawa | |
| 6,530,515 B1 | 3/2003 | Glenn et al. | |
| 6,534,900 B2 | 3/2003 | Aigner et al. | |
| 6,542,055 B1 | 4/2003 | Frank et al. | |
| 6,548,942 B1 | 4/2003 | Panaski | |
| 6,550,664 B2 | 4/2003 | Bradley et al. | |
| 6,564,448 B1 | 5/2003 | Oura et al. | |
| 6,566,979 B2 | 5/2003 | Larson et al. | |
| 6,583,374 B2 | 6/2003 | Knieser et al. | |
| 6,583,688 B2 | 6/2003 | Klee et al. | |
| 6,593,870 B2 | 7/2003 | Dummermuth et al. | |
| 6,600,390 B2 | 7/2003 | Frank | |
| 6,601,276 B2 | 8/2003 | Barber | |
| 6,617,249 B2 | 9/2003 | Ruby et al. | |
| 6,617,750 B2 | 9/2003 | Dummermuth et al. | |
| 6,630,753 B2 | 10/2003 | Malik et al. | |
| 6,635,509 B1 | 10/2003 | Ouellet | |
| 6,639,872 B1 | 10/2003 | Rein | |
| 6,651,488 B2 | 11/2003 | Larson et al. | |
| 6,657,363 B1 | 12/2003 | Aigner | |
| 6,668,618 B2 | 12/2003 | Larson et al. | |
| 6,670,866 B2 | 12/2003 | Ellaet et al. | 333/133 |
| 6,693,500 B2 | 2/2004 | Yang et al. | |
| 6,710,508 B2 | 3/2004 | Ruby et al. | |
| 6,710,681 B2 | 3/2004 | Figueredo et al. | |
| 6,714,102 B2 | 3/2004 | Ruby et al. | |
| 6,720,844 B1* | 4/2004 | Lakin | 333/189 |
| 6,720,846 B2 | 4/2004 | Iwashita et al. | |
| 6,724,266 B2 | 4/2004 | Piazza et al. | |
| 6,774,746 B2 | 8/2004 | Whatmore et al. | |
| 6,777,263 B1 | 8/2004 | Gan et al. | |
| 6,787,048 B2 | 9/2004 | Bradley et al. | |
| 6,788,170 B1 | 9/2004 | Kaitila et al. | |
| 1,097,116 A1 | 10/2004 | Larson, III et al. | |
| 6,803,835 B2 | 10/2004 | Frank | |
| 6,812,619 B1 | 11/2004 | Kaitila et al. | |
| 6,828,713 B2 | 12/2004 | Bradley et al. | |
| 6,842,088 B2 | 1/2005 | Yamada et al. | |
| 6,873,065 B2 | 3/2005 | Haigh et al. | |
| 6,873,529 B2 | 3/2005 | Ikuta et al. | |
| 6,874,211 B2 | 4/2005 | Bradley et al. | |
| 6,874,212 B2 | 4/2005 | Larson, III | |
| 6,888,424 B2 | 5/2005 | Takeuchi et al. | |
| 6,900,705 B2 | 5/2005 | Nakamura et al. | |
| 6,903,452 B2 | 6/2005 | Ma et al. | |
| 6,906,451 B2 | 6/2005 | Yamada | |
| 6,911,708 B2 | 6/2005 | Park | |
| 6,917,261 B2 | 7/2005 | Unterberger | |
| 6,924,583 B2 | 8/2005 | Lin et al. | |
| 6,924,717 B2 | 8/2005 | Ginsburg et al. | |
| 6,927,651 B2 | 8/2005 | Larson, III et al. | |
| 6,936,928 B2 | 8/2005 | Hedler et al. | |
| 6,936,954 B2 | 8/2005 | Peczalski | |
| 6,946,928 B2* | 9/2005 | Larson et al. | 333/189 |
| 6,954,121 B2 | 10/2005 | Bradley et al. | |
| 6,963,257 B2 | 11/2005 | Ella et al. | |
| 6,975,183 B2 | 12/2005 | Aigner et al. | |
| 6,977,563 B2 | 12/2005 | Komuro et al. | |

| | | |
|---|---|---|
| 6,985,052 B2 | 1/2006 | Tikka |
| 6,987,433 B2 | 1/2006 | Larson et al. |
| 6,989,723 B2 | 1/2006 | Komuro et al. |
| 6,998,940 B2 | 2/2006 | Metzger |
| 7,019,604 B2 | 3/2006 | Gotoh et al. |
| 7,019,605 B2 * | 3/2006 | Larson et al. ............... 333/187 |
| 7,057,476 B2 | 6/2006 | Hwu |
| 7,084,553 B2 | 8/2006 | Ludwiczak |
| 7,091,649 B2 | 8/2006 | Larson, III |
| 7,098,758 B2 | 8/2006 | Wang et al. |
| 7,170,215 B2 | 1/2007 | Namba et al. |
| 7,173,504 B2 | 2/2007 | Larson |
| 7,187,254 B2 | 3/2007 | Su et al. |
| 7,230,509 B2 | 6/2007 | Stoemmer |
| 2002/0000646 A1 | 1/2002 | Gooch et al. |
| 2002/0030424 A1 | 3/2002 | Iwata |
| 2002/0121944 A1 | 9/2002 | Larson, III et al. |
| 2002/0121945 A1 | 9/2002 | Ruby et al. |
| 2002/0152803 A1 | 10/2002 | Larson, III et al. |
| 2002/0190814 A1 | 12/2002 | Yamada et al. |
| 2003/0001251 A1 | 1/2003 | Cheever et al. |
| 2003/0006502 A1 | 1/2003 | Karpman |
| 2003/0087469 A1 | 5/2003 | Ma |
| 2003/0102776 A1 | 6/2003 | Takeda et al. |
| 2003/0111439 A1 | 6/2003 | Fetter et al. |
| 2003/0128081 A1 | 7/2003 | Ella et al. ................... 333/133 |
| 2003/0132493 A1 | 7/2003 | Kang et al. |
| 2003/0141946 A1 | 7/2003 | Ruby et al. |
| 2003/0179053 A1 | 9/2003 | Aigner et al. |
| 2004/0092234 A1 | 5/2004 | Pohjonen |
| 2004/0124952 A1 | 7/2004 | Tikka |
| 2004/0150293 A1 * | 8/2004 | Unterberger ................ 310/322 |
| 2004/0150296 A1 | 8/2004 | Park et al. |
| 2004/0195937 A1 | 10/2004 | Matsubara et al. |
| 2004/0257172 A1 | 12/2004 | Schmidhammer et al. |
| 2004/0263287 A1 | 12/2004 | Ginsburg et al. |
| 2005/0012570 A1 | 1/2005 | Korden et al. |
| 2005/0023931 A1 | 2/2005 | Bouche et al. |
| 2005/0030126 A1 | 2/2005 | Inoue et al. |
| 2005/0036604 A1 | 2/2005 | Scott et al. |
| 2005/0057117 A1 | 3/2005 | Nakatsuka et al. |
| 2005/0057324 A1 | 3/2005 | Onishi et al. |
| 2005/0068124 A1 * | 3/2005 | Stoemmer ................... 333/189 |
| 2005/0093396 A1 | 5/2005 | Larson et al. |
| 2005/0093653 A1 | 5/2005 | Larson, III |
| 2005/0093654 A1 | 5/2005 | Larson, III et al. |
| 2005/0093655 A1 | 5/2005 | Larson, III et al. |
| 2005/0093657 A1 | 5/2005 | Larson et al. |
| 2005/0093658 A1 | 5/2005 | Larson et al. |
| 2005/0093659 A1 | 5/2005 | Larson, III et al. |
| 2005/0104690 A1 | 5/2005 | Larson et al. |
| 2005/0110598 A1 | 5/2005 | Larson, III |
| 2005/0128030 A1 | 6/2005 | Larson et al. |
| 2005/0140466 A1 | 6/2005 | Larson, III et al. |
| 2005/0167795 A1 | 8/2005 | Higashi |
| 2005/0193507 A1 | 9/2005 | Ludwiczak |
| 2005/0206271 A1 | 9/2005 | Higuchi et al. |
| 2005/0218488 A1 | 10/2005 | Mie |
| 2006/0087199 A1 | 4/2006 | Larson et al. |
| 2006/0103492 A1 | 5/2006 | Feng et al. |
| 2006/0132262 A1 | 6/2006 | Fazzlo et al. |
| 2006/0164183 A1 | 7/2006 | Tikka |
| 2006/0185139 A1 | 8/2006 | Larson, III et al. |
| 2007/0084964 A1 | 4/2007 | John et al. |
| 2007/0085447 A1 | 4/2007 | Larson |
| 2007/0085631 A1 | 4/2007 | Larson et al. |
| 2007/0085632 A1 | 4/2007 | Larson et al. |
| 2007/0086080 A1 | 4/2007 | Larson et al. |
| 2007/0086274 A1 | 4/2007 | Nishimura et al. |
| 2007/0090892 A1 | 4/2007 | Larson |
| 2007/0170815 A1 | 7/2007 | Unkrich |
| 2007/0171002 A1 | 7/2007 | Unkrich |

FOREIGN PATENT DOCUMENTS

| | | |
|---|---|---|
| EP | 0865157 | 9/1998 |
| EP | 0 880 227 | 11/1998 |
| EP | 1 047 189 | 4/1999 |
| EP | 0973256 | 1/2000 |
| EP | 1 100 196 | 5/2001 |
| EP | 1096259 | 5/2001 |
| EP | 1258990 | 11/2002 |
| EP | 1180494 | 3/2003 |
| EP | 1 542 362 | 6/2003 |
| EP | 1 557 945 | 10/2003 |
| EP | 1258989 | 1/2004 |
| EP | 1528674 | 6/2004 |
| EP | 1528675 | 6/2004 |
| EP | 1528677 | 7/2004 |
| EP | 1 517 444 | 8/2004 |
| EP | 1249932 | 3/2005 |
| EP | 1517443 | 3/2005 |
| EP | 1575165 | 9/2005 |
| GB | 1207974 | 11/1967 |
| GB | 2411239 | 8/2005 |
| GB | 2418791 | 4/2006 |
| JP | 2002-217676 | 8/2002 |
| WO | WO 98/16957 | 4/1998 |
| WO | WO-01/06647 | 1/2001 |
| WO | WO-01/99276 | 12/2001 |
| WO | WO-02/103900 | 12/2002 |
| WO | WO 03/030358 A1 | 4/2003 |
| WO | WO-03/043188 | 5/2003 |
| WO | WO 03/050950 | 6/2003 |
| WO | WO 03/058809 | 7/2003 |
| WO | WO-2003/058809 | 7/2003 |
| WO | WO 2004/034579 | 4/2004 |
| WO | WO-2004/051744 | 6/2004 |
| WO | WO-2005/043752 | 5/2005 |
| WO | WO-2005/043753 | 5/2005 |
| WO | WO-2005/043756 | 5/2005 |

OTHER PUBLICATIONS

B. Hadimioglu et al., "Polymer Films As Acoustic Matching Layers", 1990 IEEE Ultrasonics Sysmposium Proceedings, vol. 3 pp. 1337-1340, Dec. 1990.

Jung, Jun-Phil, "Experimental and Theoretical INvestigation on the Relationship between AIN Properties and AIN-based FBAR Characterisitics", IEEE Internations Frequency Control Symposium, May 4, 2003, pp. 779-784.

Krishnaswamy, S.V., et al., "Film Bulk Acoustic Wave Resonatior Technology", Ultrasonic Symposium, 1990, pp. 529-535.

Lobl, H.P., et al., "Piezoelectric Material for BAW Resonators and Filters", IEEE Ultrasonics Symposium Oct. 5, 2003, pp. 807-811.

Martin, et al., "Development of Low-Dielectric Constant Polymer for Fabrication of Integrated Circuit Interconnect", 12 Advanced Materials, pp. 1769-1778.

Yang, C.-M., Highly C-Axis-Oriented AIN Film Using MOCVD for 5GHz-Band FBAR Filter, IEEE Ultrasonics Symposium, Oct. 5, 2003, 99, 170-173.

Examination Report from corresponding application No. GB0605971.1 dated Aug. 24, 2006.

Examination Report corresponding to application No. GB0605770.7 dated Aug. 25, 2006.

Examination Report from corresponding application No. GB0605779.8 dated Aug. 23, 2006.

Holzlohner, Ronald et al., "Accurate Calculation of Eye Diagrams and Bit Error Rates in Optical Transmission Systems Using Linearization", *Journal of Lightwave Technology*, vol. 20, No. 3., (Mar. 2002),pp. 389-400.

Reinhardt, Alexandre et al., "Design of Coupled Resonator Filters Using Admittance and Scattering Matrices", *2003 IEEE Ultrasonics Symposium*, (May 3, 2003),1428-1431.

"Examination Report corresponding to application No.", GB0605776.6, (Aug. 30, 2006).

"Search report from corresponding application No.", GB0620152.9, (Nov. 15, 2006).

"Search report from corresponding application No.", GB0620655.1, (Nov. 17, 2006).

"Search report from corresponding application No.", GB0620653.6, (Nov. 17, 2006).

"Search report from corresponding application No.", GB0620657.7, (Nov. 23, 2006).

Coombs, Clyde F., et al., "Electronic Instrument Handbook", *Second Edition, McGraw-Hill, Inc.*, (1995), pp. 5.1 to 5.29.

"A GB Search Report for", Application No. GB0522393.8, (Jan. 9, 2006),4 pages.

"A GB Search Report for Application No.", GB0525884.3, (Feb. 2, 2006),4 pgs.

Auld, B. A., "Acoustic Resonators", *Acoustic Fields and Waves in Solids, Second Edition, vol. II*, (1990),250-259.

"British Search Report Application No.", 0605205.9, (Jul. 11, 2006).

Tiersten, H. F., et al., "An Analysis of Thiskness-Extensional Trapped Energy Resonant Device Structures with Rectangular Electrodes in the Piezoelectric Thin Film on Silicon Configuration", *J. Appl. Phys.* 54 (10), (Oct. 1983),5893-5910.

"Search Report from corresponding application", No. GB0605225.2.

"Search Report for Great Britain Patent Application", No. 0617742.2, (Mar. 29, 2007).

"Search Report for Great Britain Patent Application", No. 0617742.2, (Dec. 13, 2006).

"Search Report in the Great Britian Patent Application", No. 0619698.4, (Nov. 30, 2006).

Ruby, R. et al., "The Effect of Perimeter Geometry on FBAR Resonator Electrical Performance", *Microwave Symposium Digest, 2005 IEEE MTT-S International*, (Jun. 12, 2005),217-221.

Schuessler, Hans H., "Ceramic Filters and Resonators", *Reprinted from IEEE Trans. Sonics Ultrason.* SU-21, (Oct. 1974),257-268.

Fattinger, G. G., et al., "Coupled Bulk Acoustic Wave Resonator Filters: Key technology for single-to-balanced RF filters", 0-7803-8331-1/4W20.00; *IEEE MTT-S Digest*, (2004),927-929

Choi, Sungjin et al., "Design of Half-Bridge Piezo-Transformer Converters in the AC Adapter Applications", *IEEE* 2005, 244-248.

Li, Yunxiu et al., "AC-DC Converter with Worldwide Range Input Voltage by Series and Parallel Piezoelectric Transformer Connection", 35th *Annual IEEE Power Electronics Specialists Conference*, (2004).

Ivensky, Gregory et al., "A Comparison of Piezoelectric Transformer AC/DC Converters with Current Doubler and voltage Doubler Rectifiers", *IEEE Transactions on Power Electronics*, vol. 19, No. 6., (Nov. 2004).

Navas, J. et al., "Miniaturised Battery Charger using Piezoelectric Transformers", *IEEE*, (2001), 492-496.

Jiang, Yimin et al., "A Novel Single-Phase Power Factor Correction Scheme", *IEEE*, (1993),287-292.

Lakin, K.M. "Coupled Resonator Filters", 2002 *IEEE Ultrasonics Symposium*, (Mar. 2, 2002),901-908.

Lakin, K.M. et al., "High Performance Stacked Crystal Filters for GPS and Wide Bandwidth Applications", 2001 *IEEE Ultrasonics Symposium*, (Jan. 1, 2001),833-838.

* cited by examiner

US 7,391,285 B2

FILM ACOUSTICALLY-COUPLED TRANSFORMER

RELATED APPLICATION

This application is a Continuation-in-Part of U.S. patent application Ser. No. 10/699,289, filed Oct. 30, 2003, now U.S. Pat. No. 7,019,605, of John D. Larson III entitled Stacked Bulk Acoustic Resonator Band-Pass Filler with Controllable Pass Bandwidth and of U.S. patent application Ser. No. 10/699,481, filed Oct. 30, 2003, now U.S. Pat. No. 6,946, 928, of John D. Larson III and Richard Ruby entitled Thin-Film Acoustically-Coupled Transformer. This application is also related to U.S. patent application Ser. No. 10/965,449 of John D. Larson III and Stephen Ellis entitled Pass Bandwidth Control in Decoupled Stacked Bulk Acoustic Resonator Devices and to U.S. patent application Ser. No. 10/965,541 of John D. Larson III, Richard Ruby and Stephen Ellis entitled Decoupled Stacked Bulk Acoustic Resonator Band-Pass Filter with Controllable Pass Bandwidth, both filed on the filing date of this application. The above applications are all assigned to the assignee of this application and the disclosures of the above applications are incorporated into this application by reference.

BACKGROUND ON THE INVENTION

Transformers are used in many types of electronic device to perform such functions as transforming impedances, linking single-ended circuitry with balanced circuitry or vice versa and providing electrical isolation. However, not all transformers have all of these properties. For example, an autotransformer does not provide electrical isolation.

Transformers operating at audio and radio frequencies up to VHF are commonly built as coupled primary and secondary windings around a high permeability core. The core contains the magnetic flux and increases the coupling between the windings. A transformer operable in this frequency range can also be realized using an optical-coupler. An opto-coupler used in this mode is referred to in the art as an opto-isolator.

In transformers based on coupled windings or opto-couplers, the input electrical signal is converted to a different form (i.e., a magnetic flux or photons) that interacts with an appropriate transforming structure (i.e., another winding or a light detector), and is re-constituted as an electrical signal at the output. For example, an opto-coupler converts an input electrical signal to photons using a light-emitting diode. The photons pass through an optical fiber or free space that provides isolation. A photodiode illuminated by the photons generates an output electrical signal from the photon stream. The output electrical signal is a replica of the input electrical signal At UHF and microwave frequencies, coil-based transformers become impractical due to such factors as losses in the core, losses in the windings, capacitance between the windings, and a difficulty to make them small enough to prevent wavelength-related problems. Transformers for such frequencies are based on quarter-wavelength transmission lines, e.g., Marchand type, series input/parallel output connected lines, etc. Transformers also exist that are based on micromachined coupled coils sets and are small enough that wavelength effects are unimportant. However such transformers have issues with high insertion loss.

All the transformers just described for use at UHF and microwave frequencies have dimensions that make them less desirable for use in modern miniature, high-density applications such as cellular telephones. Such transformers also tend to be high in cost because they are not capable of being manufactured by a batch process and because they are essentially an off-chip solution. Moreover, although such transformers typically have a bandwidth that is acceptable for use in cellular telephones, they typically have an insertion loss greater than 1 dB, which is too high.

Opto-couplers are not used at UHF and microwave frequencies due to the junction capacitance of the input LED, non-linearities inherent in the photodetector and insufficient isolation to give good common mode rejection.

What is needed, therefore, is a transformer capable of providing one or more of the following attributes at electrical frequencies in the range from UHF to microwave: impedance transformation, coupling between balanced and unbalanced circuits and electrical isolation. What is also needed is such a transformer that has a low insertion loss, a bandwidth sufficient to accommodate the frequency range of cellular telephone RF signals, for example, a size smaller than transformers currently used in cellular telephones and a low manufacturing cost.

SUMMARY OF THE INVENTION

In a first aspect, the invention provides a film acoustically-coupled transformer (FACT) having a decoupled stacked bulk acoustic resonator (DSBAR) that comprises a lower film bulk acoustic resonator (FBAR), an upper FBAR stacked on the lower FBAR, and, between the FBARs, an acoustic decoupler comprising a layer of acoustic decoupling material. Each of the FBARs comprises opposed planar electrodes and a piezoelectric element between the electrodes. The FACT additionally comprises first terminals electrically connected to the electrodes of one of the FBARs and second terminals electrically connected to the electrodes of the other of the FBARs. An FACT in accordance with this aspect of the invention has a 1:1 impedance transformation ratio, is capable of linking single-ended circuitry with balanced circuitry or vice versa and provides electrical isolation between primary and secondary.

In a another aspect, the invention provides a film acoustically-coupled transformer (FACT) comprising decoupled stacked bulk acoustic resonators (DSBARs). Each of the DSBARs comprises a lower film bulk acoustic resonator (FBAR), an upper FBAR stacked on the lower FBAR, and, between the FBARs, an acoustic decoupler comprising a layer of acoustic decoupling material. Each FBAR comprises opposed planar electrodes and a piezoelectric element between the electrodes. The FACT additionally comprises a first electrical circuit interconnecting the lower FBARs and a second electrical circuit interconnecting the upper FBARs. All embodiments of a FACT in accordance with this aspect of the invention are capable of linking single-ended circuitry with balanced circuitry or vice versa, and provides electrical isolation between primary and secondary.

Some embodiments of the FACT in accordance with this aspect of the invention are inherently electrically balanced and have a higher common-mode rejection ratio than the above-described embodiment having the single DSBAR. In such embodiments, the first electrical circuit electrically connects one of the FBARs of the first DSBAR either in anti-parallel or in series with one of the FBARs of the second DSBAR, and the second electrical circuit electrically connects the other of the FBARs of the first DSBAR either in anti-parallel or in series with the other of the FBARs of the second DSBAR. An embodiment of the FACT in which the first electrical circuit connects the respective FBARs in anti-parallel and the second electrical circuit connects the respective FBARs in anti-parallel has a 1:1 impedance transformation ratio between the first electrical circuit and the second electrical circuit and vice versa. An embodiment in which the first electrical circuit connects the respective FBARs in series and the second electrical circuit connects the respective FBARs in series also has a 1:1 impedance transformation ratio between the first electrical circuit and the second electrical circuit and vice versa. However, the impedances are higher than the embodiment in which the FBARs are connected in anti-parallel. An embodiment of the FACT in which the first electrical circuit connects the respective FBARs in anti-parallel and the second electrical circuit connects the respective FBARs in series has a 1:4 impedance transformation ratio between the first electrical circuit and the second electrical circuit and a 4:1 impedance transformation ratio between the second electrical circuit and the first electrical circuit. An embodiment of the FACT in which the first electrical circuit connects the respective FBARs in series and the second electrical circuit connects the respective FBARs in anti-parallel has a 4:1 impedance transformation ratio between the first electrical circuit and the second electrical circuit and a 1:4 impedance transformation ratio between the second electrical circuit and the first electrical circuit.

Other embodiments of the FACT in accordance with the invention are electrically unbalanced and can be used in applications in which a high common-mode rejection ratio is less important. In such embodiments, the first electrical circuit electrically connects one of the FBARs of the first DSBAR either in parallel or in anti-series with one of the FBARs of the second DSBAR, and the second electrical circuit electrically connects the other of the FBARs of the first DSBAR either in parallel or in anti-series with the other of the FBARs of the second DSBAR.

In a another aspect, the invention provides a film acoustically-coupled transformer (FACT) comprising a decoupled stacked bulk acoustic resonator (DSBAR). The DSBAR comprises a lower film bulk acoustic resonator (FBAR), an upper FBAR stacked on the lower FBAR, and an acoustic decoupler comprising a layer of acoustic decoupling material having an acoustic impedance of about 2 Mrayl. Each of the FBARs comprises opposed planar electrodes and a piezoelectric element between the electrodes. The FACT additionally comprises first terminals electrically connected to the electrodes of the lower FBAR and second terminals electrically connected to the electrodes of the upper FBAR.

DETAILED DESCRIPTION

Figure 1A:
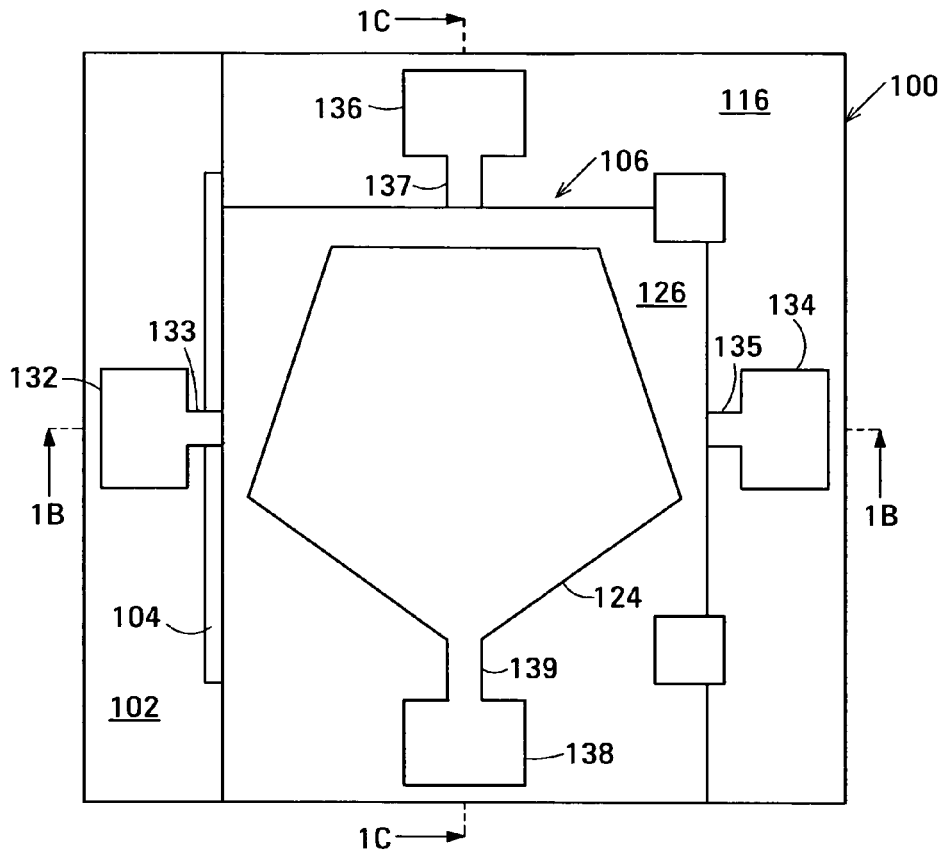
FIG. 1A is a plan view of an example of a first embodiment of a film acoustically-coupled transformer (FACT) in accordance with the invention
Figure 1B:
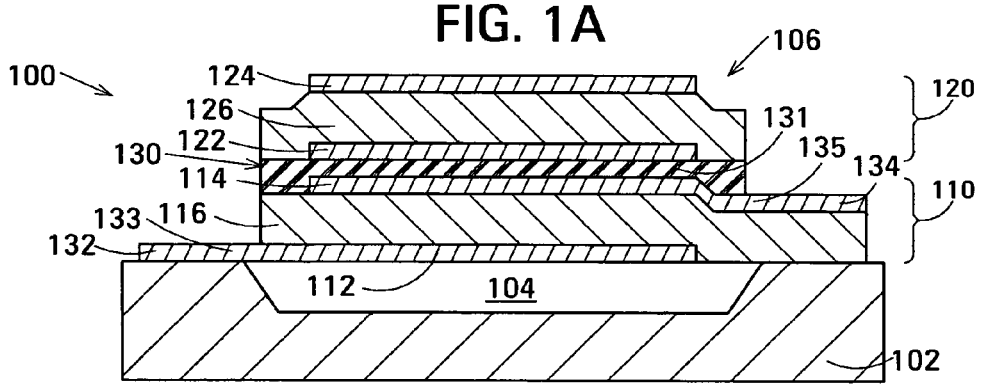
FIGS. 1B and 1C are cross-sectional views of the FACT along section lines 1B-1B and 1C-1C, respectively, in FIG. 1A.
Figure 1C:
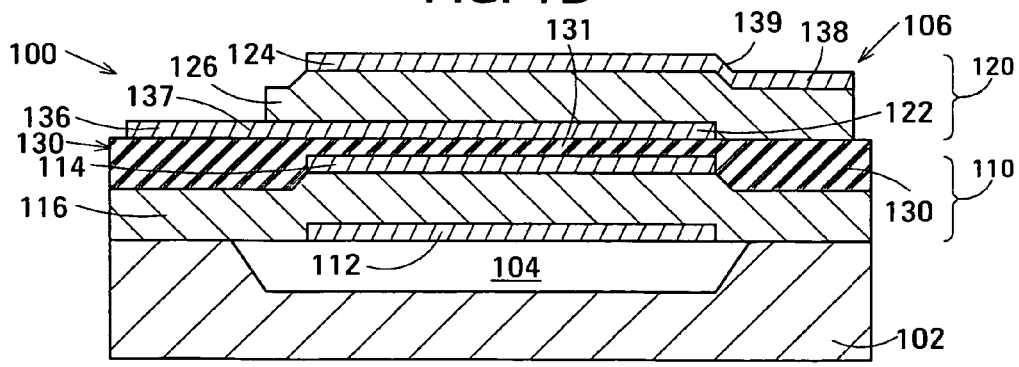

FIGS. 1A, 1B and 1C show a plan view and two cross-sectional views, respectively, of a first embodiment 100 of a film acoustically-coupled transformer (FACT) in accordance with the invention. FACT 100 has a 1:1 impedance transformation ratio, is capable of linking single-ended circuitry with balanced circuitry or vice versa and provides electrical isolation between primary and secondary.

FACT 100 is composed of a decoupled stacked bulk acoustic resonator (DSBAR) 106, first terminals 132 and 134 and second terminals 136 and 138. DSBAR 106 is composed of a stacked pair of film bulk acoustic resonators (FBARs) 110 and 120 and an acoustic decoupler 130 between them. In the example shown, FBAR 120 is stacked atop FBAR 110. FBAR 110 is composed of opposed planar electrodes 112 and 114 and a layer of piezoelectric material 116 between the electrodes. FBAR 120 is composed of opposed planar electrodes 122 and 124 and a layer of piezoelectric material 126 between the electrodes. Acoustic decoupler 130 is located between electrode 114 of FBAR 110 and electrode 122 of FBAR 120. The acoustic decoupler controls the coupling of acoustic energy between FBARs 110 and 120.

In the example shown, first terminals 132 and 134 are structured as bonding pads electrically connected by electrical traces 133 and 135, respectively, to electrodes 112 and 114, respectively, of FBAR 110. Also in the example shown, second terminals 136 and 138 are structured as bonding pads electrically connected by electrical traces 137 and 139, respectively, to electrodes 122 and 124, respectively, of FBAR 120. In an embodiment, first terminals 132 and 134 constitute the primary terminals and the second terminals 136 and 138 constitute the secondary terminals of FACT 100. In an alternative embodiment, first terminals 132 and 134 constitute the secondary terminals and second terminals 136 and 138 constitute the primary terminals of FACT 100.

In the example shown, DSBAR 106 is suspended over a cavity 104 defined in a substrate 102. Suspending the DSBAR over a cavity allows the FBARs of the DSBAR to resonate mechanically. Other suspension schemes that allow the FBARs to resonate mechanically are possible. For example, the DSBAR can be located over a mismatched acoustic Bragg reflector (not shown) formed in or on substrate 102, as disclosed by Lakin in U.S. Pat. No. 6,107,721, the disclosure of which is incorporated into this disclosure by reference.

FBARs are disclosed by Ruby et al. in U.S. Pat. No. 5,587,620 entitled Tunable Thin Film Acoustic Resonators and Method of Making Same, now assigned to the assignee of this disclosure and incorporated in this disclosure by reference. Ruby's disclosure also discloses a stacked film bulk acoustic resonator (SBAR) composed of two layers of piezoelectric material interleaved with three planar electrodes. Ruby's SBAR can be regarded as being composed of a stacked pair of FBARs in which one electrode is common to both FBARs, and will be referred to herein as a common-electrode SBAR. The common electrode renders the common-electrode SBAR incapable of linking balanced to unbalanced circuits and vice versa and of providing electrical isolation between primary and secondary. Moreover, the common electrode SBAR exhibits an extremely narrow pass bandwidth that makes it unsuitable for use in most applications. The narrow pass bandwidth is the result of the common electrode, which over couples acoustic energy between the FBARs.

As noted above, FACT 100 in accordance with the invention comprises a stacked pair of film bulk acoustic resonators (FBARs) 110 and 120 and acoustic decoupler 130 between FBARs 110 and 120. A structure composed of a stacked pair of FBARs and an acoustic decoupler between the FBARs is referred to herein as a decoupled stacked bulk acoustic resonator (DSBAR) to distinguish it from the above-described conventional common-electrode SBAR in which the FBARs directly contact one another. In FACT 100, acoustic decoupler 130 controls the coupling of acoustic energy between stacked FBARs 110 and 120 and additionally electrically isolates FBAR 110 from FBAR 120. The electrical isolation provided by acoustic decoupler 130 enables FACT 100 to link balanced to unbalanced circuits and vice versa and provides electrical isolation between primary and secondary. The acoustic coupling provided by acoustic decoupler 130 is substantially less than the acoustic coupling between the FBARs in the common-electrode SBAR referred to above. As a result, FBARs 110 and 120 are not over coupled, and FACT 100 has a relatively flat response in the pass band, as will be described below with reference to FIG. 2.

Figure 1D:
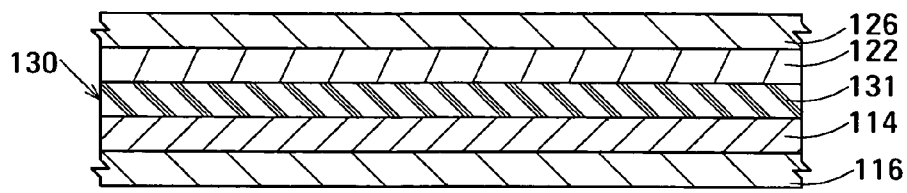
FIG. 1D is an enlarged cross-sectional view of part of the FACT shown in FIG. 1A along the section line 1B-1B showing an embodiment of the acoustic decoupler in accordance with the invention.

The embodiment of the acoustic decoupler 130 shown in FIGS. 1A-1C is a first embodiment composed of layer 131 of acoustic decoupling material located between the electrodes 114 and 122 of FBARs 110 and 120, respectively. FIG. 1D is an enlarged view showing this first embodiment of the acoustic decoupler in more detail. Important properties of the acoustic decoupling material of layer 131 that constitutes acoustic decoupler 130 are an acoustic impedance less than that of the materials of FBARs 110, 120, a high electrical resistivity, a low dielectric permittivity and a nominal thickness that is an odd integral multiple of one quarter of the wavelength in the acoustic decoupling material of an acoustic signal equal in frequency to the center frequency of the pass band of FACT 100.

The acoustic decoupling material of acoustic decoupler 130 has an acoustic impedance less that of the materials of FBARs 110 and 120 and substantially greater than that of air. The acoustic impedance of a material is the ratio of stress to particle velocity in the material and is measured in Rayleighs, abbreviated as rayl. The materials of the FBARs are typically aluminum nitride (AlN) as the material of piezoelectric layers 116, 126 and molybdenum (Mo) as the material of electrodes 112, 114, 122 and 124. The acoustic impedances of the materials of the FBARs are typically greater than 30 Mrayl (35 Mrayl for AlN and 63 Mrayl for Mo) and the acoustic impedance of air is about 1 krayl. In embodiments of FACT 100 in which the materials of FBARs 110, 120 are as stated above, materials with an acoustic impedance in the range from about 2 Mrayl to about 8 Mrayl work well as the acoustic coupling material of acoustic decoupler 130.

Figure 2:
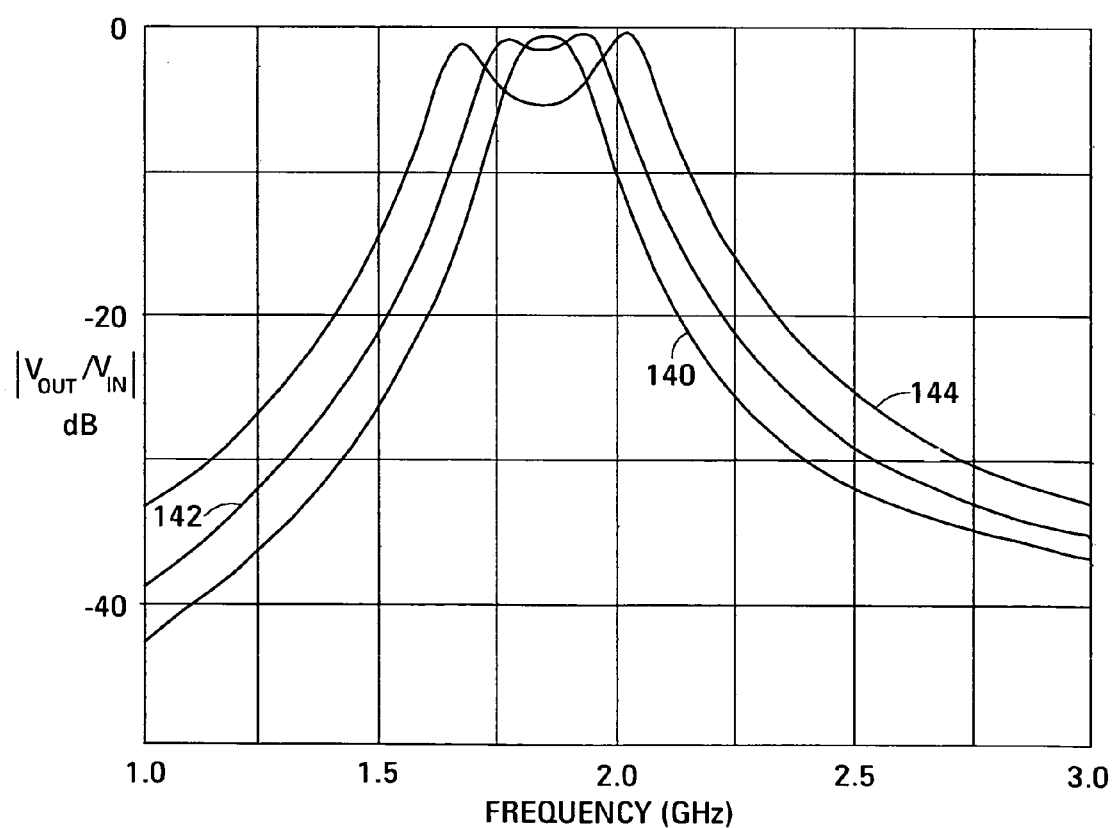
FIG. 2 a graph showing how the calculated frequency response of embodiments of the FACT shown in FIGS. 1A-1C depends on the acoustic impedance of the acoustic decoupling material.

FIG. 2 is a graph showing how the calculated frequency response of FACT 100 depends on the acoustic impedance of the acoustic decoupling material of layer 131 that constitutes the first embodiment of acoustic decoupler 130. The embodiment illustrated has a center frequency of about 1,900 MHz. Calculated frequency responses for embodiments in which the acoustic decoupling material of the acoustic decoupler has acoustic impedances of about 4 Mrayl (polyimide—curve 140), 8 Mrayl (curve 142) and 16 Mrayl (curve 144) are shown. It can be seen that the bandwidth of FACT 100 increases with increasing acoustic impedance of the acoustic decoupling material. In the embodiment in which the acoustic impedance is 16 Mrayl, the resonances of the FBARs are over coupled, which causes the characteristic double peak in the pass band response.

The embodiment of acoustic decoupler 130 shown in FIGS. 1B, 1C and 1D is composed of layer 131 of acoustic decoupling material with a nominal thickness equal to one quarter of the wavelength in the acoustic decoupling material of an acoustic signal equal in frequency to the center frequency of the pass band of FACT 100, i.e., $t \approx \lambda_n/4$, where t is the thickness of the layer 131 of acoustic decoupling material that constitutes acoustic decoupler 130 and $\lambda_n$ is the wavelength in the acoustic decoupling material of an acoustic signal equal in frequency to the center frequency. A thickness of layer 131 within approximately ±10% of the nominal thickness can alternatively be used. A thickness outside this range can alternatively be used with some degradation in performance. However, the thickness of layer 131 should differ significantly from $0\lambda_n$ at one extreme and $\lambda_n/2$ at the other extreme.

More generally, the first embodiment of acoustic decoupler 130 shown in FIG. 1D is composed of layer 131 of acoustic decoupling material with a nominal thickness equal to an odd integral multiple of one quarter of the wavelength in the acoustic decoupling material of an acoustic signal equal in frequency to the center frequency of the pass band of FACT 100, i.e., $t \approx (2m+1)\lambda_n/4$, where t and $\lambda_n$ are as defined above and m is an integer equal to or greater than zero. In this case, a thickness of layer 131 that differs from the nominal thickness by approximately ±10% of $\lambda_n/4$ can alternatively be used. A thickness tolerance outside this range can be used with some degradation in performance, but the thickness of layer 131 should differ significantly from an integral multiple of $\lambda_n/2$. However, embodiments of acoustic decoupler 130 in which layer 131 of acoustic decoupling material is an odd integral multiple greater than unity of one quarter of the wavelength in the acoustic decoupling material of an acoustic signal equal in frequency to the center frequency typically have frequency responses that exhibit spurious response artifacts due to the ability of such thicker layer to support multiple acoustic modes.

Many plastic materials have acoustic impedances in the range stated above and can be applied in layers of uniform thickness in the thickness ranges stated above. Such plastic materials are therefore potentially suitable for use as the acoustic decoupling material of layer 131 of acoustic decoupler 130. However, the acoustic decoupling material must also be capable of withstanding the temperatures of the fabrication operations performed after layer 131 of acoustic decoupling material has been deposited on electrode 114 to form acoustic decoupler 130. As will be described in more detail below, in practical embodiments of FACT 100, electrodes 122 and 124 and piezoelectric layer 126 are deposited by sputtering after layer 131 has been deposited. Temperatures as high as 400° C. are reached during these deposition processes. Thus, a plastic that remains stable at such temperatures is used as the acoustic decoupling material.

Plastic materials typically have a very high acoustical attenuation per unit length compared with the other materials of FBARs 110 and 120. However, since the above-described embodiment of acoustic decoupler 130 is composed of layer 131 of plastic acoustic decoupling material typically of the order of 1 µm thick, the acoustic attenuation introduced by layer 131 is typically negligible.

In one embodiment, a polyimide is used as the acoustic decoupling material of layer 131. Polyimide is sold under the trademark Kapton® by E. I. du Pont de Nemours and Company. In such embodiment, acoustic decoupler 130 is composed of layer 131 of polyimide applied to electrode 114 by spin coating. Polyimide has an acoustic impedance of about 4 Mrayl.

In another embodiment, a poly(para-xylylene) is used as the acoustic decoupling material of layer 131. In such embodiment, acoustic decoupler 130 is composed of layer 131 of poly(para-xylylene) applied to electrode 114 by vacuum deposition. Poly(para-xylylene) is also known in the art as parylene. The dimer precursor di-para-xylylene from which parylene is made and equipment for performing vacuum deposition of layers of parylene are available from many suppliers. Parylene has an acoustic impedance of about 2.8 Mrayl.

In another embodiment, a crosslinked polyphenylene polymer is used as the acoustic decoupling material of layer 131. In such embodiment, acoustic decoupler 130 is composed of layer 131 of a crosslinked polyphenylene polymer applied by spin coating. Crosslinked polyphenylene polymers have been developed as low dielectric constant dielectric materials for use in integrated circuits and consequently remain stable at the high temperatures to which acoustic decoupler 130 is subject during the subsequent fabrication of FBAR 120. The inventors have discovered that crosslinked polyphenylene polymers additionally have a calculated acoustic impedance of about 2 Mrayl. This acoustic impedance is in the range of acoustic impedances that provides FACT 100 with a useful pass bandwidth.

Precursor solutions containing various oligomers that polymerize to form respective crosslinked polyphenylene polymers are sold by The Dow Chemical Company, Midland, Mich., under the trademark SiLK. The precursor solutions are applied by spin coating. The crosslinked polyphenylene polymer obtained from one of these precursor solutions designated SiLK™ J, which additionally contains an adhesion promoter, has a calculated acoustic impedance of 2.1 Mrayl, i.e., about 2 Mrayl.

The oligomers that polymerize to form crosslinked polyphenylene polymers are prepared from biscyclopentadienone- and aromatic acetylene-containing monomers. Using such monomers forms soluble oligomers without the need for undue substitution. The precursor solution contains a specific oligomer dissolved in gamma-butyrolactone and cyclohexanone solvents. The percentage of the oligomer in the precursor solution determines the layer thickness when the precursor solution is spun on. After application, applying heat evaporates the solvents, then cures the oligomer to form a cross-linked polymer. The biscyclopentadienones react with the acetylenes in a 4+2 cycloaddition reaction that forms a new aromatic ring. Further curing results in the cross-linked polyphenylene polymer. The above-described crosslinked polyphenylene polymers are disclosed by Godschalx et al. in U.S. Pat. No. 5,965,679, incorporated herein by reference. Additional practical details are described by Martin et al., Development of Low-Dielectric Constant Polymer for the Fabrication of Integrated Circuit Interconnect, 12 ADVANCED MATERIALS, 1769 (2000), also incorporated by reference. Compared with polyimide, crosslinked polyphenylene polymers have a lower acoustic impedance, a lower acoustic attenuation and a lower dielectric constant. Moreover, a spun-on layer of the precursor solution is capable of producing a high-quality film of the crosslinked polyphenylene polymer with a thickness of the order of 200 nm, which is a typical thickness of acoustic decoupler 130.

In an alternative embodiment, the acoustic decoupling material of layer 131 constituting acoustic decoupler 130 has an acoustic impedance substantially greater than the materials of FBARs 110 and 120. No materials having this property are known at this time, but such materials may become available in future, or lower acoustic impedance FBAR materials may become available in future. The thickness of layer 131 of such high acoustic impedance acoustic decoupling material is as described above.

Figure 1E:
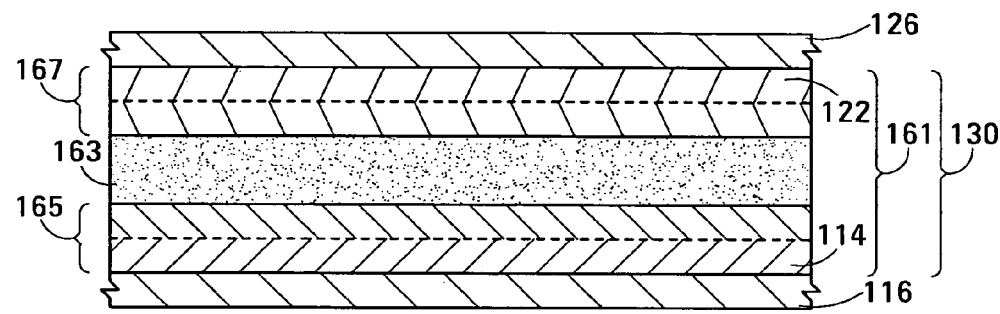
FIG. 1E is an enlarged cross-sectional view of part of the FACT shown in FIG. 1A along the section line 1B-1B showing an alternative embodiment of the acoustic decoupler.

FIG. 1E is an enlarged view of part of FACT 100 showing a second embodiment of acoustic decoupler 130 that incorporates a Bragg structure 161. Bragg structure 161 is composed of a low acoustic impedance Bragg element 163 sandwiched between high acoustic impedance Bragg elements 165 and 167. Low acoustic impedance Bragg element 163 is a layer of a low acoustic impedance material whereas high acoustic impedance Bragg elements 165 and 167 are each a layer of high acoustic impedance material. The acoustic impedances of the Bragg elements are characterized as "low" and "high" with respect to one another and additionally with respect to the acoustic impedance of the piezoelectric material of layers 116 and 126. At least one of the Bragg elements additionally has a high electrical resistivity and a low dielectric permittivity to provide electrical isolation between input and output of FACT 100.

Each of the layers constituting Bragg elements 161, 163 and 165 has a nominal thickness equal to an odd integral multiple of one quarter of the wavelength in the material the layer of an acoustic signal equal in frequency to the center frequency of the pass band of FACT 100. Layers that differ from the nominal thickness by approximately ±10% of one quarter of the wavelength can alternatively be used. A thickness tolerance outside this range can be used with some degradation in performance, but the thickness of the layers should differ significantly from an integral multiple of one-half of the wavelength.

In an embodiment, low acoustic impedance Bragg element 163 is a layer of silicon dioxide ($SiO_2$), which has an acoustic impedance of about 13 Mrayl, and each of the high acoustic impedance Bragg elements 165 and 167 is a layer of the same material as electrodes 114 and 122, respectively, i.e., molybdenum, which has an acoustic impedance of about 63 Mrayl. Using the same material for high acoustic impedance Bragg elements 165 and 167 and electrodes 114 and 122, respectively, of FBARs 110 and 120, respectively, allows high acoustic impedance Bragg elements 165 and 167 additionally to serve as electrodes 114 and 122, respectively.

In an example, high acoustic impedance Bragg elements 165 and 167 have a nominal thickness equal to one quarter of the wavelength in molybdenum of an acoustic signal equal in frequency to the center frequency of the pass band of FACT 100, and low acoustic impedance Bragg element 163 had a nominal thickness equal to three quarters of the wavelength in $SiO_2$ of an acoustic signal equal in frequency to the center frequency. Using a three-quarter wavelength-thick layer of $SiO_2$ instead of a one-quarter wavelength thick layer of $SiO_2$ as low acoustic impedance Bragg element 163 reduces the capacitance between FBARs 110 and 120.

In embodiments in which the acoustic impedance difference between high acoustic impedance Bragg elements 165 and 167 and low acoustic impedance Bragg element 163 is relatively low, Bragg structure 161 may be composed of more than one (e.g., n) low acoustic impedance Bragg element interleaved with a corresponding number (i.e., n+1) of high acoustic impedance Bragg elements. Only one of the Bragg elements need be insulating. For example, the Bragg structure may be composed of two low acoustic impedance Bragg element interleaved with three high acoustic impedance Bragg elements.

Wafer-scale fabrication is used to fabricate FACTs similar to FACT 100 thousands at a time. Wafer-scale fabrication makes each FACT inexpensive to fabricate. FACT 100 can be made using a fabrication method similar to that to be described below with reference to FIGS. 5A-5T. Accordingly, a method of fabricating FACT 100 will not be separately described.

Referring again to FIGS. 1A-1C, to use FACT 100, electrical connections are made to first terminals 132 and 134 electrically connected to electrodes 112 and 114, respectively, as shown in FIGS. 1A and 1B and electrical connections are additionally made to second terminals 136 and 138 electrically connected to electrodes 122 and 124, respectively, as shown in FIGS. 1A and 1C. The electrical connections to first terminals 132 and 134 provide electrical connections to the primary of FACT 100 and the electrical connections to second terminals 136 and 138 provide electrical connections to the secondary of FACT 100. In an alternative embodiment, the electrical connections to second terminals 136 and 138 provide electrical connections to the primary of FACT 100 and the electrical connections to first terminals 132 and 134 provide electrical connections to the secondary of FACT 100.

In operation of FACT 100, an input electrical signal applied to first terminals 132 and 134, which constitute the primary terminals of FACT 100, establishes a voltage difference between electrodes 112 and 114 of FBAR 110. The voltage difference between electrodes 112 and 114 mechanically deforms FBAR 110 at the frequency of the input electrical signal. Depending on the frequency of the input electrical signal, acoustic decoupler 130 couples all or part of the acoustic energy resulting from the mechanical deformation of FBAR 110 to FBAR 120. The acoustic energy received from FBAR 110 mechanically deforms FBAR 120 at the frequency of the input electrical signal. The mechanical deformation of FBAR 120 generates a voltage difference between electrodes 122 and 124 at the frequency of the input electrical signal. The voltage difference is output at second terminals 136 and 138, which constitute the secondary terminals of FACT 100, as an output electrical signal. Piezoelectricity is a linear effect, so the amplitude and phase of the input electrical signal applied to the first terminals is preserved in the output electrical signal output at the second terminals.

An embodiment of FACT 100 in which second terminals 136 and 138 constitute the primary terminals and first terminals 132 and 134 constitute the secondary terminals operates similarly, except acoustic energy propagates through acoustic decoupler 130 from FBAR 120 to FBAR 110.

As noted above, FACT 100 provides a 1:1 impedance transformation ratio, is capable of linking single-ended circuitry with balanced circuitry or vice versa and provides electrical isolation between primary and secondary. However, the capacitance between electrode 112 and substrate 102 differs from that between electrode 114 and the substrate. As a result, FACT 100 is not perfectly balanced electrically and can have an insufficient common-mode rejection ratio (CMRR) for certain applications.

Figure 3A:
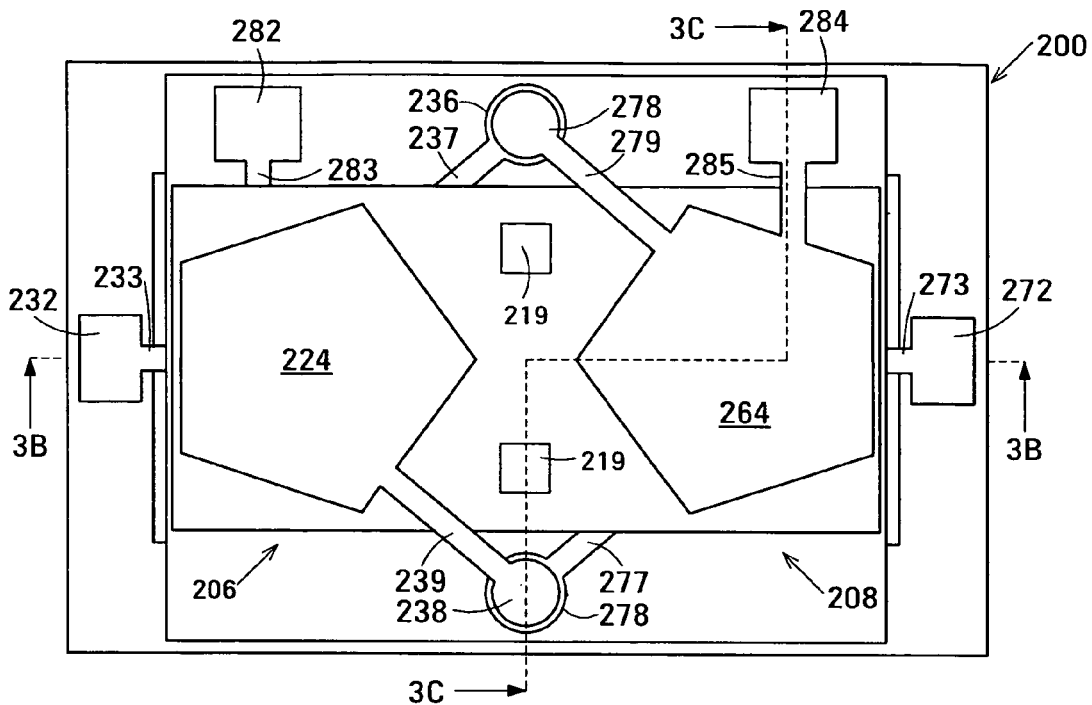
FIG. 3A is a plan view of an example of a second embodiment of a FACT in accordance with the invention
Figure 3B:
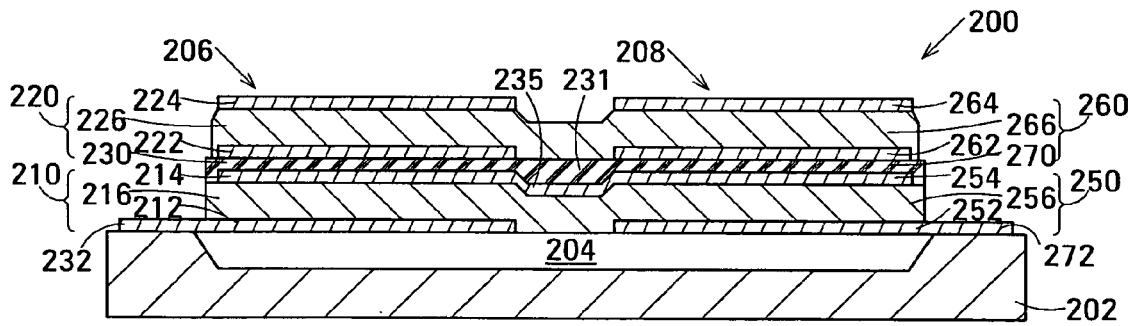
FIGS. 3B and 3C are cross-sectional views of the FACT along section lines 3B-3B and 3C-3C, respectively, in FIG. 1A.
Figure 3C:
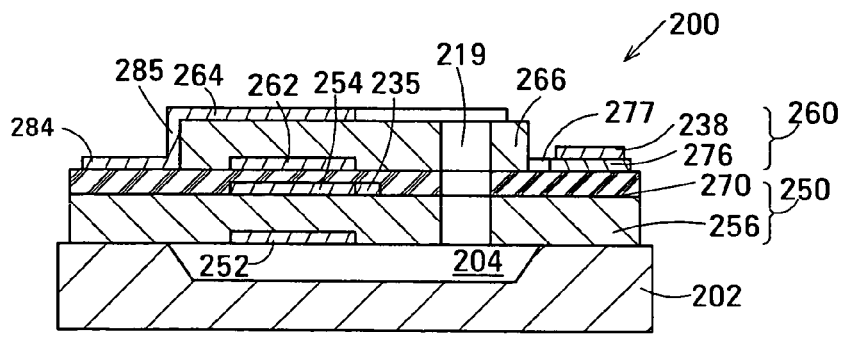

FIGS. 3A-3C show a plan view and two cross-sectional views, respectively, of a second embodiment 200 of a film acoustically-coupled transformer (FACT) in accordance with the invention. FACT 200 is capable of linking single-ended circuitry with balanced circuitry or vice versa, provides electrical isolation between primary and secondary. Some embodiments of FACT 200 are electrically balanced, and therefore have a high common-mode rejection ratio: other embodiments are electrically unbalanced and have a lower common-mode rejection ratio. FACT 200 has an impedance transformation ratio of 1:1, 1:4 or 4:1 depending on the configurations of the electrical circuits that form part of the FACT.

FACT 200 is composed of two decoupled stacked bulk acoustic resonators (DSBARs) 206 and 208. Each DSBAR is composed of a stacked pair of film bulk acoustic resonators (FBARs) and an acoustic decoupler between the FBARs. FACT 200 is additionally composed of an electrical circuit that connects one of the FBARs of DSBAR 206 to one of the FBARs of DSBAR 208, and an electrical circuit that connects the other of the FBARs of DSBAR 206 to the other of the FBARs of DSBAR 208.

DSBAR 206 is composed of a stacked pair of FBARs 210 and 220 and an acoustic decoupler 230 between them. DSBAR 208 is composed of a stacked pair of FBARs 250 and 260 and an acoustic decoupler 270 between them. In the example shown, FBAR 220 is stacked atop FBAR 210 and FBAR 260 is stacked atop FBAR 250. FBAR 210 is composed of opposed planar electrodes 212 and 214 and a layer of piezoelectric material 216 between the electrodes. FBAR 220 is composed of opposed planar electrodes 222 and 224 and a layer of piezoelectric material 226 between the electrodes. FBAR 250 is composed of opposed planar electrodes 252 and 254 and a layer of piezoelectric material 256 between the electrodes. FBAR 260 is composed of opposed planar electrodes 262 and 264 and a layer of piezoelectric material 266 between the electrodes.

As noted above, an electrical circuit connects one of the FBARs of DSBAR 206 to one of the FBARs of DSBAR 208, and an electrical circuit connects the other of the FBARs of DSBAR 206 to the other of the FBARs of DSBAR 206. Each electrical circuit electrically connects the respective FBARs in any one of a parallel, a series, an anti-parallel and an anti-series configuration. Of the sixteen possible combinations of the parallel, series, anti-parallel and anti-series electrical circuit configurations, only eight produce a working FACT. The combination of electrical circuit configurations connecting the FBARs determines whether the FACT is electrically balanced (high common-mode rejection ratio) or electrically unbalanced, and determines the impedance transformation ratio of the FACT, i.e., 1:1, 1:4 or 4:1. The possible combinations of electrical circuit configurations are summarized in Table 1 below:

TABLE 1

|  | Parallel | Series | Anti-par. | Anti-series |
| --- | --- | --- | --- | --- |
| Parallel | U 1:1 | X | X | U 1:4 |
| Series | X | B 1:1 | B 4:1 | X |
| Anti-par. | X | B 1:4 | B 1:1 | X |
| Anti-series | U 4:1 | X | X | U 1:1 |

In Table 1, the row captions indicate the configuration of one of the electrical circuits, e.g., electrical circuit 245 described below with reference to FIG. 4C, the column captions indicate the configuration of the other of the electrical circuits, e.g., electrical circuit 246 described with reference to FIG. 4C, B denotes that the FACT is electrically balanced, U denotes that the FACT is unbalanced, and X denotes a non-functioning FACT. The impedance transformation ratio shown is the impedance transformation from electrical terminals connected to the electrical circuit indicated by the row caption to electrical terminals connected to the electrical circuit indicated by the column caption.

The electrical circuits shown in Table 1 are subject to the constraint that an electrical circuit may only connect the electrodes of FBARs at the same level as one another in DSBARs 206 and 208, i.e., one of the electrical circuits may only connect the electrodes of FBARs 210 and 250 and the other of the electrical circuits may only connect the electrodes of FBARs 220 and 260. Table 1 additionally assumes that the c-axes of piezoelectric layers 216, 226, 256 and 266 are all oriented in the same direction. More electrical circuits are possible in embodiments not subject to the constraint, e.g., in embodiments in which an electrical circuit is allowed to connect the electrodes of FBARs 210 and 260 and the electrodes of FBARs 220 and 250, and/or the assumption.

Before the electrical circuits interconnecting the FBARs are described in detail, the terms anti-parallel, parallel, anti-series and series as applied to the electrical circuits connecting the electrodes of FBARs of different DSBARs will be defined. An FBAR is a polarity-dependent device. A voltage of a given polarity applied between the electrodes of the FBAR will cause the FBAR to contract mechanically while the same voltage of the opposite polarity will cause the FBAR to expand mechanically by the same amount. Similarly, a mechanical stress applied to the FBAR that causes the FBAR to contract mechanically will generate a voltage of the given polarity between the electrodes of the FBAR whereas a mechanical stress that causes the FBAR to expand mechanically will generate a voltage of the opposite polarity between the electrodes of the FBAR.

Referring to FIGS. 4A-4D, in FACT 200, the electrodes of the FBARs that an electrical circuit connects in parallel are at the same level in the respective DSBARs. A signal applied to the FBARs connected in parallel produces signals of the same phase across the FBARs. The FBARs therefore expand and contract in phase, and generate acoustic energy in phase. On the other hand, electrodes of the FBARs that an electrical circuit connects in anti-parallel are at different levels in the respective DSBARs. A signal applied to FBARs connected in anti-parallel produces signals of the opposite phases across the FBARs. The FBARs therefore expand and contract in antiphase, and generate acoustic energy in antiphase.

The electrodes of the FBARs that an electrical circuit connects in series are at the same level in the respective DSBARs. A signal applied to the FBARs connected in series produces signals of opposite phases across the FBARs. The FBARs expand and contract in antiphase, and generate acoustic energy in antiphase. On the other hand, the electrodes of the FBARs that an electrical circuit connects in anti-series are at different levels in the respective DSBARs. A signal applied to the FBARs connected in anti-series produces signals of the same phase across the FBARs. The FBARs expand and contract in phase and generate acoustic energy in phase.

FBARs receiving acoustic energy that causes them to expand and contract in phase generate signals in phase. Connecting FBARs that generate signals in phase in parallel produces a signal level equal to that across the individual FBARs and an impedance of one-half the characteristic impedance of the individual FBARs. Connecting such FBARs in anti-series produces a signal level of twice that across the individual FBARs and an impedance of twice the characteristic impedance of the individual FBARs. However, connecting FBARs that generate signals in phase in anti-parallel or in series causes the signals to cancel. FBARs receiving acoustic energy that causes them to expand and contract in antiphase generate signals in antiphase. Connecting FBARs that generate signals in antiphase in antiparallel produces a signal equal in level to that across the individual FBARs and an impedance of one-half the characteristic impedance of the individual FBARs. Connecting such FBARs in series produces a signal of twice the level of that across the individual FBARs and an impedance of twice the characteristic impedance of the individual FBARs. However, connecting FBARs that generate signals in antiphase in parallel or in antiseries causes the signals to cancel. The FACTs indicated in Table 1 as being non-functional are FACTs in which the FBARs that receive acoustic energy generate signals that cancel.

Figure 4A:
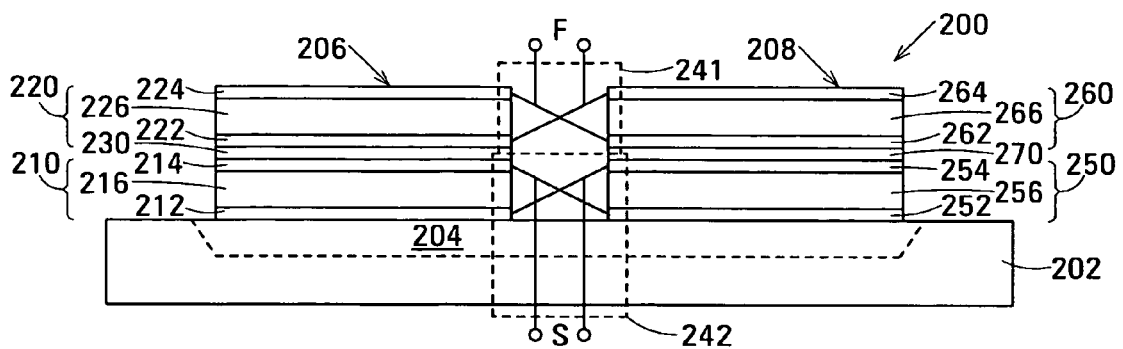
FIGS. 4A through 4D are schematic drawings showing the electrical circuits of electrically balanced embodiments of the FACT shown in FIGS. 3A-3C.
Figure 4B:
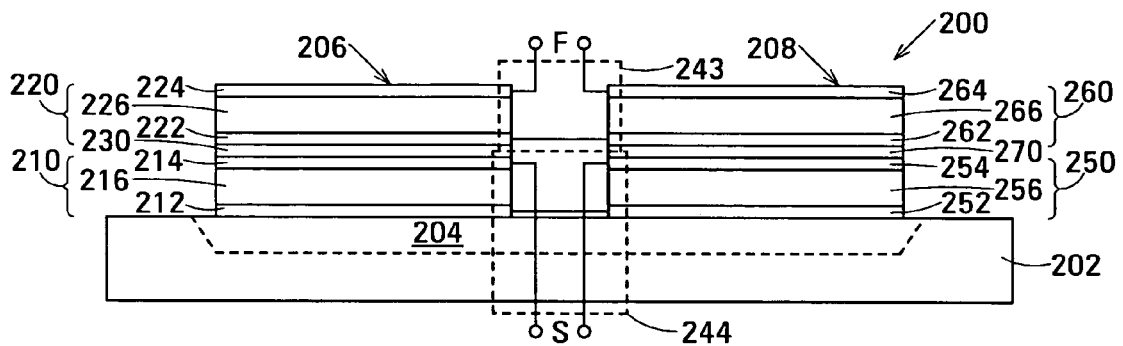

FIGS. 4A and 4B schematically illustrate two configurations of electrical circuits that connect the FBARs 210 and 220 of DSBAR 206 and the FBARs 250 and 260 of DSBAR 208 in anti-parallel or in series, respectively, to form respective electrically-balanced embodiments of a FACT having a 1:1 impedance transformation ratio.

FIG. 4A shows an electrical circuit 241 electrically connecting one of the FBARs of DSBAR 206 in anti-parallel with one of the FBARs of DSBAR 208 and to first terminals F and an electrical circuit 242 electrically connecting the other of the FBARs of DSBAR 206 in anti-parallel with the other of the FBARs of DSBAR 208 and to second terminals S. In the example shown, the electrical circuit 241 electrically connects FBAR 220 of DSBAR 206 in anti-parallel with FBAR 260 of DSBAR 208 and to first terminals F, and electrical circuit 242 electrically connects FBAR 210 of DSBAR 206 in anti-parallel with FBAR 250 of DSBAR 208 and to second terminals S.

Specifically, electrical circuit 241 electrically connects electrode 222 of FBAR 220 to electrode 264 of FBAR 260 and to one of the first terminals F and additionally electrically connects electrode 224 of FBAR 220 to electrode 262 of FBAR 260 and to the other of the first terminals F. Electrical circuit 242 electrically connects electrode 214 of FBAR 210 to electrode 252 of FBAR 250 and to one of the second terminals S and additionally electrically connects electrode 212 of FBAR 210 to electrode 254 of FBAR 250 and to the other of the second terminals S.

Electrical circuit 241 electrically connects FBARs 220 and 260 in anti-parallel so that an input electrical signal applied to the first terminals F is applied equally but in antiphase to FBARs 220 and 260. Electrical circuit 241 electrically connects FBARs 220 and 260 in anti-parallel in the sense that an electrical signal applied to first terminals F that causes FBAR 220 to contract mechanically additionally causes FBAR 260 to expand mechanically by the same amount, and vice versa. The acoustic energy generated by FBAR 260 is therefore in antiphase with the acoustic energy generated by FBAR 220. Consequently, the acoustic energy received by FBAR 250 from FBAR 260 is in antiphase with the acoustic energy received by FBAR 210 from FBAR 220, and the signal between electrodes 214 and 212 is in antiphase with the signal between electrodes 254 and 252. Electrical circuit 242 connects FBARs 210 and 250 in anti-parallel, so that the signal output to the second terminals S is in phase with the signal between electrodes 214 and 212 and also with the signal between electrodes 254 and 252. As a result, the signal between second terminals S is the same as the signal across either of FBARs 210 and 250.

Substantially the same capacitance exists between each of the first terminals F and substrate 202. Each first terminal has connected to it one electrode closer to the substrate and one electrode further from the substrate. In the example shown, one first terminal has electrode 222 closer to the substrate and electrode 264 further from the substrate connected to it and the other first terminal has electrode 262 closer to the substrate and electrode 224 further from the substrate connected to it. Moreover, substantially the same capacitance exists between each of the second terminals S and substrate 202. Each second terminal has connected to it one electrode closer to the substrate and one electrode further from the substrate. In the example shown, one second terminal has electrode 212 closer to the substrate and electrode 254 further from the substrate connected to it and the other second terminal has electrode 252 closer to the substrate and electrode 214 further from the substrate connected to it. Thus, the embodiment of FACT 200 shown in FIG. 4A is electrically balanced and, as a result, has a common-mode rejection ratio sufficiently high for many more applications than the FACT 100 described above with reference to FIGS. 1A-1C.

The embodiment of FACT 200 shown in FIG. 4A has a 1:1 impedance transformation ratio. First terminals F may serve as the primary terminals or the secondary terminals of the FACT and second terminals P may serve as the secondary terminals or the primary terminals, respectively, of the FACT. An input electrical signal applied to the primary terminals is output at substantially the same level at the secondary terminals. In a typical embodiment in which all of the FBARs 210, 220, 250 and 260 have a similar characteristic impedance, the impedance seen at the primary terminals and at the secondary terminals is that of two FBARs in parallel, i.e., one half of the typical characteristic impedance of a single FBAR. Thus, the embodiment of FACT 200 shown in FIG. 4A is suitable for use in relatively low characteristic impedance applications.

FIG. 4B schematically shows an electrical circuit 243 electrically connecting one of the FBARs of DSBAR 206 and one of the FBARs of DSBAR 208 in series between first terminals F and an electrical circuit 244 electrically connecting the other of the FBARs of DSBAR 206 and the other of the FBARs of DSBAR 208 in series between second terminals S. In the example shown in FIG. 4B, electrical circuit 243 electrically connects FBAR 220 of DSBAR 206 and FBAR 260 of DSBAR 208 in series between first terminals F, and electrical circuit 244 electrically connects FBAR 210 of DSBAR 206 and FBAR 250 of DSBAR 208 in series between second terminals S.

Specifically, electrical circuit 243 electrically connects electrode 222 of FBAR 220 to electrode 262 of FBAR 260 and additionally electrically connects electrode 224 of FBAR 220 to one of the first terminals F and electrically connects electrode 264 of FBAR 260 to the other of the first terminals F. In a variation, electrical circuit 243 electrically connects electrode 224 of FBAR 220 to electrode 264 of FBAR 260 and additionally electrically connects electrode 222 of FBAR 220 and electrode 262 of FBAR 260 to first terminals F. Electrical circuit 244 electrically connects electrode 212 of FBAR 210 to electrode 252 of FBAR 250 and additionally electrically connects electrode 214 of FBAR 210 to one of the second terminals S and additionally electrically connects electrode 254 of FBAR 250 to the other of the second terminals S. In a variation, electrical circuit 244 electrically connects electrode 214 of FBAR 210 to electrode 254 of FBAR 250 and additionally electrically connects electrode 212 of FBAR 210 and electrode 252 of FBAR 250 to second terminals S.

Electrical circuit 243 electrically connecting FBARs 220 and 260 in series divides an input electrical signal applied to the first terminals F approximately equally between FBARs 220 and 260. FBARs 220 and 260 are connected in series in the sense that an electrical signal applied to first terminals F that causes FBAR 220 to contract mechanically causes FBAR 260 to expand mechanically by the same amount, and vice versa. The acoustic energy generated by FBAR 260 is therefore in antiphase with the acoustic energy generated by FBAR 220. The acoustic energy received by FBAR 250 from FBAR 260 is in antiphase with the acoustic energy received by FBAR 210 from FBAR 220 and the signal on electrode 254 is in antiphase with the signal on electrode 214. Electrical circuit 244 electrically connects FBARs 210 and 250 in series so that the signal at second terminals S is twice the signal across either of FBARs 210 and 250.

Substantially the same capacitance exists between each of the first terminals F and substrate 202. Electrodes 224 and 264 connected to the first terminals are at the same distance from the substrate. Moreover, substantially the same capacitance exists between each of the second terminals S and substrate 202. Electrodes 214 and 254 connected to the second terminals are at the same distance from the substrate. Thus, the embodiment of FACT 200 shown in FIG. 4B is electrically balanced and, as a result, has a common-mode rejection ratio sufficiently high for many more applications than the FACT 100 described above with reference to FIGS. 1A-1C.

The embodiment of FACT 200 shown in FIG. 4B has a 1:1 impedance transformation ratio. First terminals F may serve as the primary terminals or the secondary terminals of the FACT and second terminals P may serve as the secondary terminals or the primary terminals, respectively, of the FACT. An input electrical signal applied to the primary terminals is output at substantially the same level at the secondary terminals. In a typical embodiment in which all of the FBARs 210, 220, 250 and 260 have a similar characteristic impedance, the impedance seen at the primary terminals and at the secondary terminals is that of two FBARs in series, i.e., twice the typical characteristic impedance of a single FBAR. Thus, the embodiment of FACT 200 shown in FIG. 4B is suitable for use in higher characteristic impedance applications than that shown in FIG. 4A.

Figure 4C:
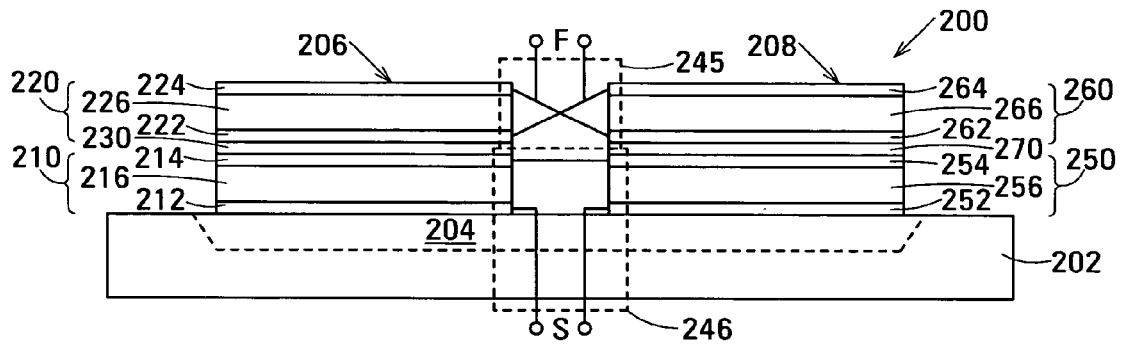
Figure 4D:
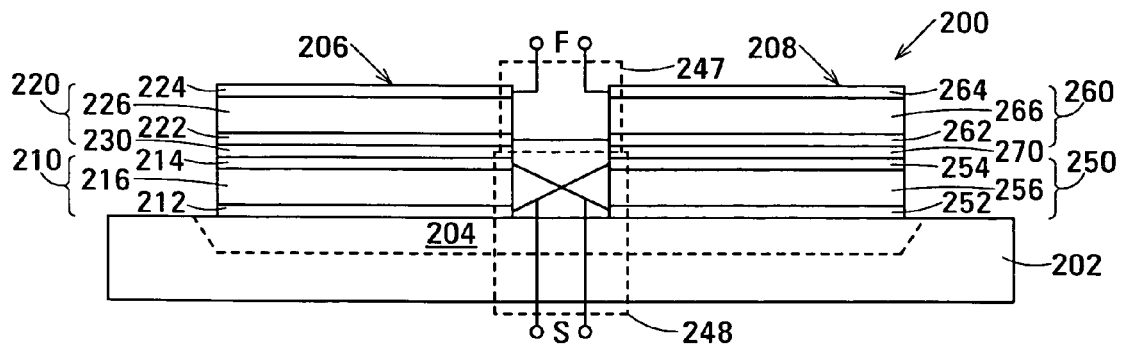

FIGS. 4C and 4D schematically illustrate two configurations of electrical circuits that connect the FBARs 210 and 220 of DSBAR 206 and the FBARs 250 and 260 of DSBAR 208 in anti-parallel and in series to form respective embodiments of a FACT having a 1:4 or 4:1 impedance transformation ratio. FIG. 4C shows an electrical circuit 245 electrically connecting one of the FBARs of DSBAR 206 in anti-parallel with one of the FBARs of DSBAR 208 and to first terminals F and an electrical circuit 246 electrically connecting the other of the FBARs of DSBAR 206 and the other of the FBARs of DSBAR 208 in series between second terminals S. In the example shown, the electrical circuit 245 electrically connects FBAR 220 of DSBAR 206 in anti-parallel with FBAR 260 of DSBAR 208 and to first terminals P, and electrical circuit 246 electrically connects FBAR 210 of DSBAR 206 and FBAR 250 of DSBAR 208 in series between second terminals S.

Specifically, electrical circuit 245 electrically connects electrode 222 of FBAR 220 to electrode 264 of FBAR 260 and to one of the first terminals F, and additionally electrically connects electrode 224 of FBAR 220 to electrode 262 of FBAR 260 and to the other of the first terminals F. Electrical circuit 246 electrically connects electrode 214 of FBAR 210 to electrode 254 of FBAR 250 and additionally electrically connects electrode 212 of FBAR 210 to one of the second terminals S and electrode 252 of FBAR 250 to the other of the second terminals S. In a variation, electrical circuit 246 electrically connects electrode 212 of FBAR 210 to electrode 252 of FBAR 250 and additionally electrically connects electrode 214 of FBAR 210 and electrode 254 of FBAR 250 to second terminals S.

Electrical circuit 245 electrically connects FBARs 220 and 260 in anti-parallel so that an input electrical signal applied to the first terminals F is applied equally but in antiphase to FBARs 220 and 260. Electrical circuit 245 electrically connects FBARs 220 and 260 in anti-parallel in the sense that an electrical signal applied to first terminals F that causes FBAR 220 to contract mechanically additionally causes FBAR 260 to expand mechanically by the same amount, and vice versa. The acoustic energy generated by FBAR 260 is therefore in antiphase with the acoustic energy generated by FBAR 220. Consequently, the acoustic energy received by FBAR 250 from FBAR 260 is in antiphase with the acoustic energy received by FBAR 210 from FBAR 220, and the signal on electrode 252 is in antiphase with the signal on electrode 212. Electrical circuit 246 connects FBARs 210 and 250 in series so that the voltage difference between second terminals S is twice the voltage across either of FBARs 210 and 250.

Substantially the same capacitance exists between each of the first terminals F and substrate 202. Each first terminal has connected to it one electrode closer to the substrate and one electrode further from the substrate. In the example shown, one first terminal has electrode 222 closer to the substrate and electrode 264 further from the substrate connected to it and the other first terminal has electrode 262 closer to the substrate and electrode 224 further from the substrate connected to it. Moreover, substantially the same capacitance exists between each of the second terminals S and substrate 202. Electrodes 212 and 252 connected to the second terminals are at the same distance from the substrate. Thus, the embodiment of FACT 200 shown in FIG. 4C is electrically balanced and, as a result, has a common-mode rejection ratio sufficiently high for many more applications than the FACT 100 described above with reference to FIGS. 1A-1C.

The embodiment of FACT 200 shown in FIG. 4C is a step-up FACT when first terminals F serve as primary terminals and second terminals S serve as secondary terminals. A signal applied to the primary terminals is output at twice the level at the secondary terminals. Also, in a typical embodiment in which all of the FBARs 210, 220, 250 and 260 have a similar characteristic impedance, the impedance seen at the primary terminals is that of two FBARs in parallel, i.e., one half of the typical characteristic impedance of a single FBAR, whereas the impedance seen at the secondary terminals is that of two FBARs in series, i.e., twice the typical characteristic impedance of a single FBAR. Thus, the embodiment of FACT 200 illustrated in FIG. 4C has a 1:4 primary-to-secondary impedance ratio.

The embodiment of FACT 200 shown in FIG. 4C is a step-down FACT when first terminals F serve as secondary terminals and second terminals S serve as primary terminals. In this case, the signal output at the secondary terminals is one-half the level of the input electrical signal applied to the primary terminals, and the primary-to-secondary impedance ratio is 4:1.

FIG. 4D schematically shows an electrical circuit 247 electrically connecting FBAR 220 of DSBAR 206 and FBAR 260 of DSBAR 208 in series between first terminals F, and an electrical circuit 248 electrically connecting FBAR 210 of DSBAR 206 and FBAR 250 of DSBAR 208 in anti-parallel and to second terminals S.

Specifically, electrical circuit 247 electrically connects electrode 222 of FBAR 220 to electrode 262 of FBAR 260 and additionally electrically connects electrode 224 of FBAR 220 and electrode 264 of FBAR 260 to first terminals F. Electrical circuit 248 electrically connects electrode 212 of FBAR 210 to electrode 254 of FBAR 250 and to one of the second terminals S, and additionally electrically connects electrode 214 of FBAR 210 to electrode 252 of FBAR 250 and to the other of the second terminals S. In a variation, electrical circuit 247 electrically connects electrode 224 of FBAR 220 to electrode 264 of FBAR 260 and additionally electrically connects electrode 222 of FBAR 220 and electrode 262 of FBAR 260 to first terminals F.

Electrical circuit 247 electrically connecting FBARs 220 and 260 in series divides an input electrical signal applied to the first terminals F approximately equally between FBARs 220 and 260. FBARs 220 and 260 are connected in series in the sense that an electrical signal applied to first terminals F that causes FBAR 220 to contract mechanically causes FBAR 260 to expand mechanically by the same amount, and vice versa. The acoustic energy generated by FBAR 260 is therefore in antiphase with the acoustic energy generated by FBAR 220. The acoustic energy received by FBAR 250 from FBAR 260 is in antiphase with the acoustic energy received by FBAR 210 from FBAR 220 and the voltage between electrodes 252 and 254 is in antiphase with the voltage between electrodes 212 and 214. Electrical circuit 248 electrically connects FBARs 210 and 250 in anti-parallel, so that the signal output at the second terminals S is in phase with the signal across electrodes 214 and 212 and also with the signal across electrodes 254 and 252. As a result, the signal at second terminals S is equal in level to the signal across either of FBARs 210 and 250, and is equal to one-half the level of the input electrical signal applied to first terminals F.

Substantially the same capacitance exists between each of the first terminals F and substrate 202. Electrodes 224 and 264 connected to the first terminals are the at same distance from the substrate. Moreover, substantially the same capacitance exists between each of the second terminals S and substrate 202. Each second terminal has connected to it one electrode closer to the substrate and one electrode further from the substrate. In the example shown, one second terminal has electrode 212 closer to the substrate and electrode 254 further from the substrate connected to it and the other second terminal has electrode 252 closer to the substrate and electrode 214 further from the substrate connected to it. Thus, the embodiment of FACT 200 shown in FIG. 4D is electrically balanced and, as a result, has a common-mode rejection ratio sufficiently high for many more applications than the FACT 100 described above with reference to FIGS. 1A-1C.

The embodiment of FACT 200 shown in FIG. 4D is a step-down FACT when first terminals F serve as primary terminals and second terminals S serve as secondary terminals. The signal level output at the secondary terminals is one-half that of the input electrical signal applied to the primary terminals. Also, in a typical embodiment in which all of the FBARs 210, 220, 250 and 260 have a similar characteristic impedance, the impedance seen at the primary terminals is that of two FBARs in series, i.e., twice the typical characteristic impedance of a single FBAR, whereas the impedance seen at the secondary terminals is that of two FBARs in parallel, i.e., one-half of the typical characteristic impedance of a single FBAR. Thus, the embodiment of FACT 200 illustrated in FIG. 4D has a 4:1 primary-to-secondary impedance ratio.

The embodiment of FACT 200 shown in FIG. 4D is a step-up FACT when first terminals F serve as secondary terminals and second terminals S serve as primary terminals. In this case, the signal level output at the secondary terminals is twice that of the input electrical signal applied to the primary terminals, and the primary-to-secondary impedance ratio is 1:4.

Figure 4E:
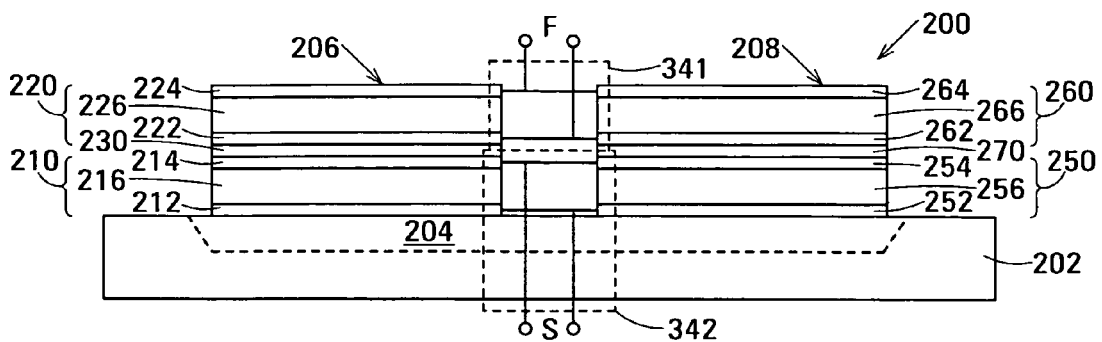
FIGS. 4E through 4H are schematic drawings showing the electrical circuits of electrically unbalanced embodiments of the FACT shown in FIGS. 3A-3C.

In applications in which a low common mode rejection ratio is unimportant, electrical circuits interconnecting the FBARs can be different from those just described. FIG. 4E shows an embodiment of a FACT with a 1:1 impedance transformation ratio in which an electrical circuit 341 connects FBAR 220 of DSBAR 206 and FBAR 260 of DSBAR 208 in parallel and to first terminals F, and an electrical circuit 342 electrically connects FBAR 210 of DSBAR 206 and FBAR 250 of DSBAR 208 in parallel and to second terminals S.

Figure 4F:
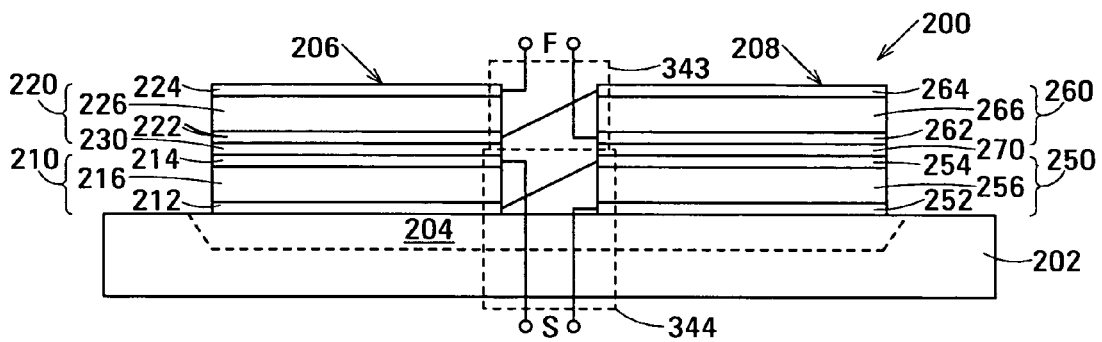

FIG. 4F shows an embodiment of a FACT with a 1:1 impedance transformation ratio in which an electrical circuit 343 connects FBAR 220 of DSBAR 206 and FBAR 260 of DSBAR 208 in anti-series between first terminals F, and an electrical circuit 344 connects FBAR 210 of DSBAR 206 and FBAR 250 of DSBAR 208 in anti-series between second terminals S.

Figure 4G:
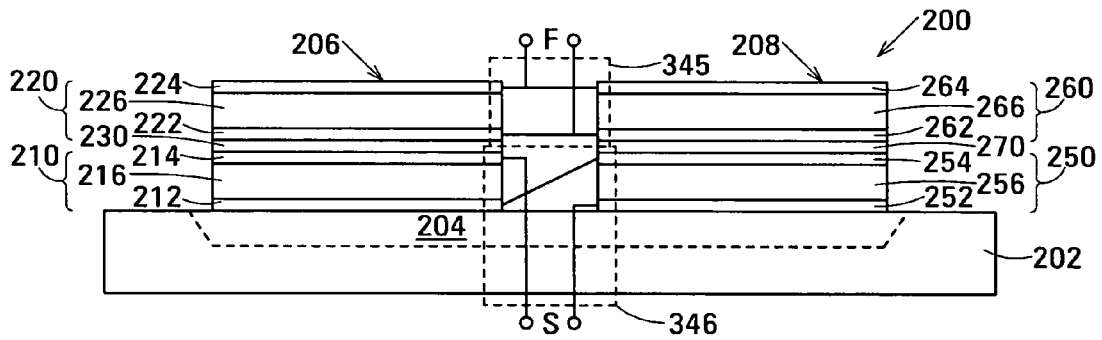

FIG. 4G shows an embodiment of a FACT in which an electrical circuit 345 electrically connects FBAR 220 of DSBAR 206 and FBAR 260 of DSBAR 208 in parallel and to first terminals F, and an electrical circuit 346 electrically connects FBAR 210 of DSBAR 206 and FBAR 250 of DSBAR 208 in anti-series between second terminals S. This embodiment has a 1:4 impedance transformation ratio when first terminals F serve as primary terminals and second terminals S serve as secondary terminals, or a 4:1 impedance transformation ratio when second terminals S serve as the primary terminals and first terminals F serve as the secondary terminals.

Figure 4H:
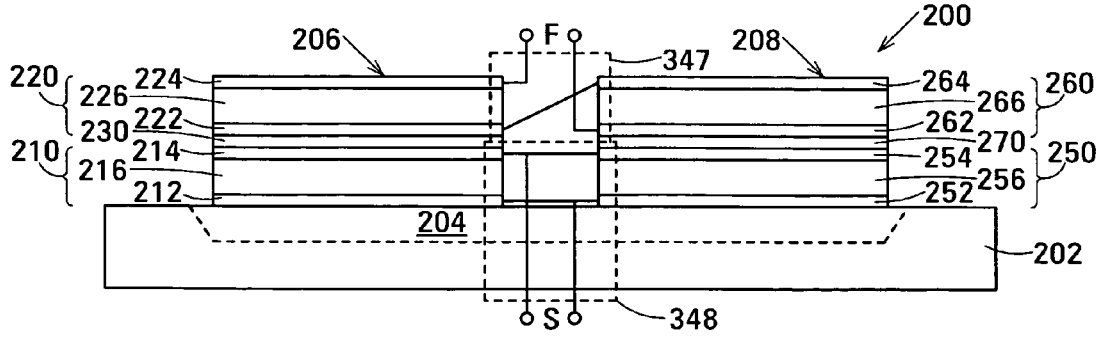

FIG. 4H shows an embodiment of a FACT in which electrical circuit 347 electrically connects FBAR 220 of DSBAR 206 and FBAR 260 of DSBAR 208 in anti-series between first terminals F, and an electrical circuit 348 electrically connects FBAR 210 of DSBAR 206 and FBAR 250 of DSBAR 208 in parallel and to second terminals S. This embodiment has a 4:1 impedance transformation ratio when first terminals F serve as primary terminals and second terminals S serve as secondary terminals, or a 1:4 impedance transformation ratio when second terminals S serve as the primary terminals and first terminals F serve as the secondary terminals.

The electrical configuration of the embodiment of the FACT 200 shown in FIGS. 3A-3C is similar to that shown in FIG. 4C. A bonding pad 282 and a bonding pad 284 constitute the first terminals of FACT 200. An interconnection pad 236, an electrical trace 237 extending from electrode 222 to interconnection pad 236 (FIG. 5G), an interconnection pad 278 in electrical contact with interconnection pad 236 and an electrical trace 279 extending from electrode 264 to interconnection pad 278 constitute the part of electrical circuit 245 (FIG. 4C) that electrically connects electrode 222 of FBAR 220 to electrode 264 of FBAR 260. An interconnection pad 238, an electrical trace 239 extending from electrode 224 to interconnection pad 238, an interconnection pad 276 in electrical contact with interconnection pad 238 and an electrical trace 277 extending from electrode 262 to interconnection pad 276 (FIG. 5G) constitute the part of electrical circuit 245 (FIG. 4C) that electrically connects electrode 224 of FBAR 220 to electrode 262 of FBAR 260. An electrical trace 283 that extends between electrode 222 and bonding pad 282 and an electrical trace 285 that extends between electrode 264 and bonding pad 284 (FIG. 5G) constitute the part of electrical circuit 245 that connects FBARs 220 and 260 connected in anti-parallel to the first terminals provided by bonding pads 282 and 284.

In an alternative embodiment, bonding pads 282 and 284 and traces 283 and 285 are omitted and interconnection pads 238 and 278 are configured as bonding pads and provide the first terminals of FACT 200.

Bonding pad 232 and bonding pad 272 constitute the second terminals of FACT 200. An electrical trace 235 that extends between electrode 214 and electrode 254 (FIG. 5E) constitutes the part of electrical circuit 246 (FIG. 4C) that connects FBAR 210 and FBAR 250 in series. An electrical trace 233 that extends between electrode 212 and bonding pad 232 and an electrical trace 273 that extends between electrode 252 and bonding pad 272 (FIG. 5C) constitutes the part of electrical circuit 246 that connects FBAR 210 and FBAR 250 to the second terminals provided by bonding pads 232 and 272.

In FACT 200, acoustic decoupler 230 is located between FBARs 210 and 220, specifically, between electrodes 214 and 222. Acoustic decoupler 230 controls the coupling of acoustic energy between FBARs 210 and 220. Additionally, acoustic decoupler 270 is located between FBARs 250 and 260, specifically, between electrodes 254 and 262. Acoustic decoupler 270 controls the coupling of acoustic energy between FBARs 250 and 260. Acoustic decoupler 230 couples less acoustic energy between the FBARs 210 and 220 than would be coupled if the FBARs were in direct contact with one another. Acoustic decoupler 270 couples less acoustic energy between the FBARs 250 and 260 than would be coupled if the FBARs were in direct contact with one another. The coupling of acoustic energy defined by acoustic decouplers 230 and 270 determines the pass bandwidth of FACT 200.

In the embodiment shown in FIGS. 3A-3C, acoustic decouplers 230 and 270 are respective parts of a layer 231 of acoustic decoupling material. Important properties of the acoustic decoupling material of layer 231 are an acoustic impedance less than that of FBARs 210, 220, 250 and 260, a nominal thickness that is an odd integral multiple of one quarter of the wavelength in the acoustic decoupling material of an acoustic signal equal in frequency to the center frequency of the pass band of the FACT 200, and a high electrical resistivity and low dielectric permittivity to provide electrical isolation between the primary and secondary of the FACT. The materials and other properties of layer 231 are similar to those described above with reference to FIGS. 1A-1D and FIG. 2. Therefore, layer 231 that provides acoustic decouplers 230 and 270 will not be further described here. In another embodiment (not shown), acoustic decouplers 230 and 270 each include a Bragg structure similar to Bragg structure 161 described above with reference to FIG. 1E. Acoustic decouplers 230 and 270 may alternatively share a common Bragg structure in a manner similar to the way in which the embodiments of acoustic couplers 230 and 270 shown in FIGS. 3A-3C share a common layer 231.

DSBAR 206 and DSBAR 208 are located adjacent one another suspended over a cavity 204 defined in a substrate 202. Suspending the DSBARs over a cavity allows the stacked FBARs in each DSBAR to resonate mechanically. Other suspension schemes that allow the stacked FBARs to resonate mechanically are possible. For example, the DSBARs can be located over a mismatched acoustic Bragg reflector (not shown) formed in or on substrate 202, as disclosed by the above-mentioned U.S. Pat. No. 6,107,721 of Lakin.

Thousands of FACTs similar to FACT 200 are fabricated at a time by wafer-scale fabrication. Such wafer-scale fabrication makes the FACTs inexpensive to fabricate. An exemplary fabrication method will be described next with reference to the plan views of FIGS. 5A-5J and the cross-sectional views of FIGS. 5K-5T. As noted above, the fabrication method can also be used to make the FACT 100 described above with reference to FIGS. 1A-1C. The pass band of the embodiment of FACT 200 whose fabrication will be described has a nominal center frequency of about 1.9 GHz. Embodiments for operation at other frequencies are similar in structure and fabrication but have thicknesses and lateral dimensions different from those exemplified below.

A wafer of single-crystal silicon is provided. A portion of the wafer constitutes, for each FACT being fabricated, a substrate corresponding to the substrate 202 of FACT 200. FIGS. 5A-5J and FIGS. 5K-5T illustrate and the following description describes the fabrication of FACT 200 in and on a portion of the wafer. As FACT 200 is fabricated, the remaining FACTs on the wafer are similarly fabricated.

Figure 5A:
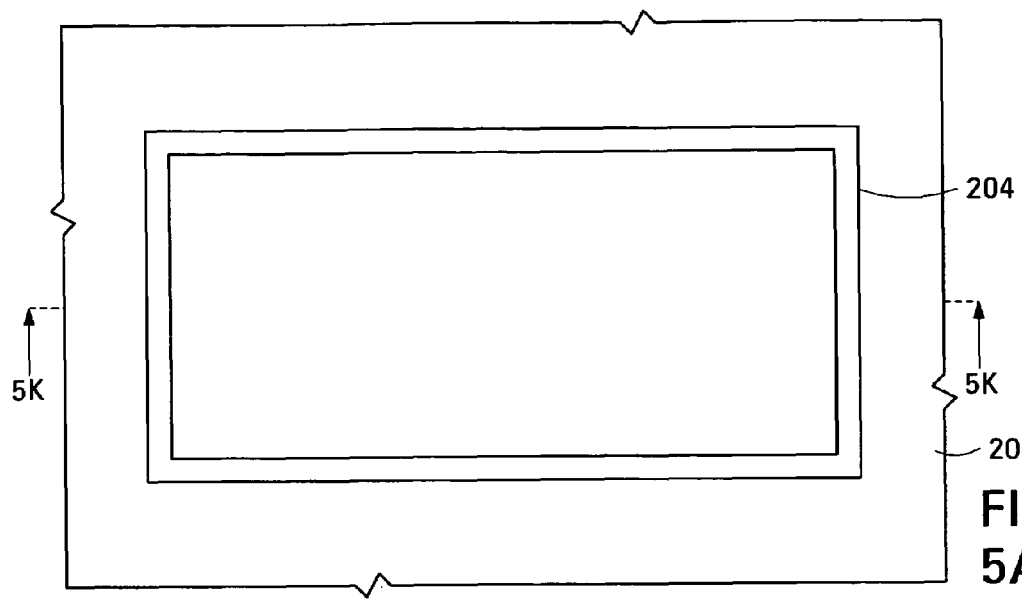
FIGS. 5A-5J are plan views illustrating a process for making a FACT in accordance with the invention.
Figure 5K:
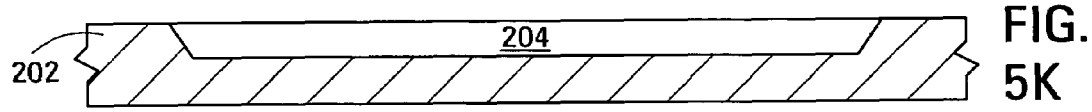
FIGS. 5K-5T are cross-sectional views along the section lines 5K-5K, 5L-5L, 5M-5M, 5N-5N, 5O-5O, 5P-5P, 5Q-5Q, 5R-5R, 5S-5S and 5T-5T in FIGS. 5A-5J, respectively.

The portion of the wafer that constitutes substrate 202 of FACT 200 is selectively wet etched to form cavity 204, as shown in FIGS. 5A and 5K.

Figure 5B:
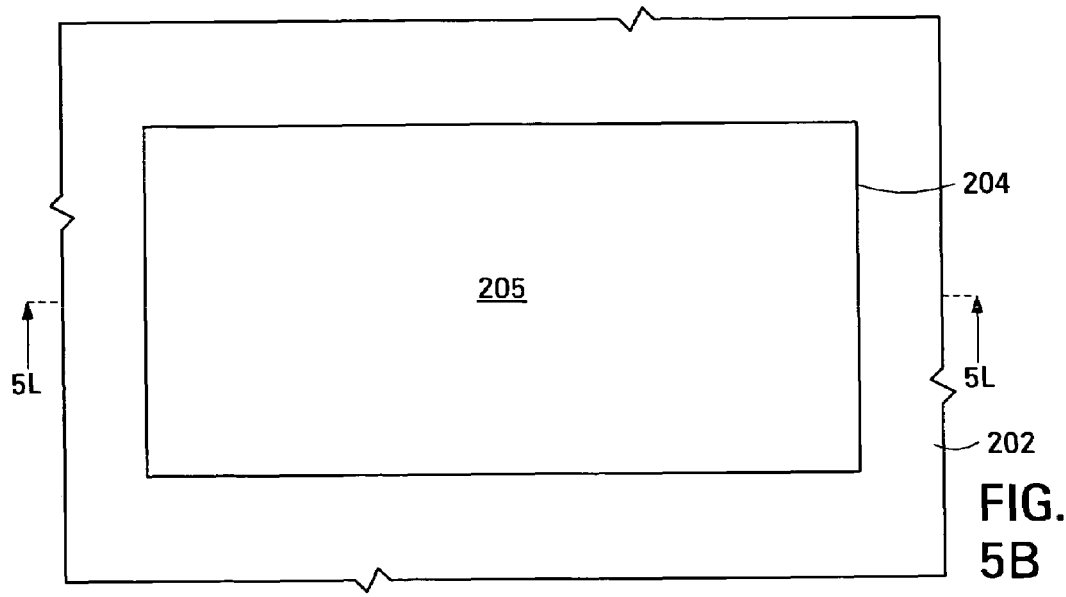
Figure 5L:
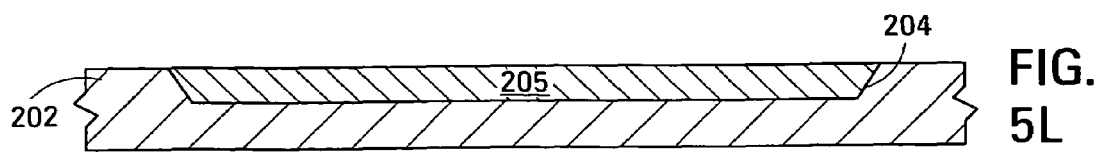

A layer of fill material (not shown) is deposited on the surface of the wafer with a thickness sufficient to fill the cavities. The surface of the wafer is then planarized to leave the cavity filled with the fill material. FIGS. 5B and 5L show cavity 204 in substrate 202 filled with fill material 205.

In an embodiment, the fill material was phosphosilicate glass (PSG) and was deposited using conventional low-pressure chemical vapor deposition (LPCVD). The fill material may alternatively be deposited by sputtering, or by spin coating.

Figure 5C:
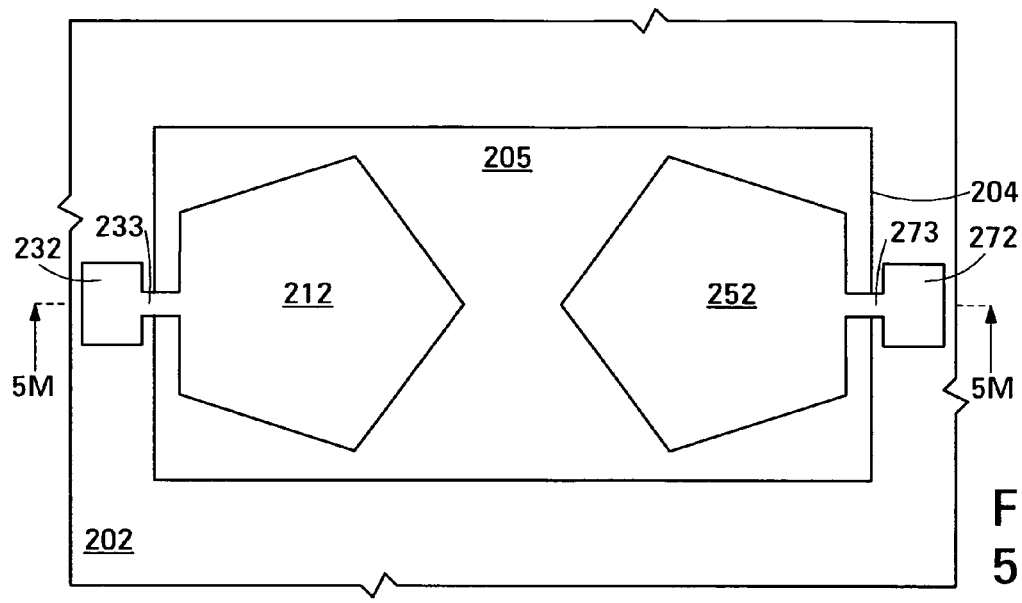
Figure 5M:
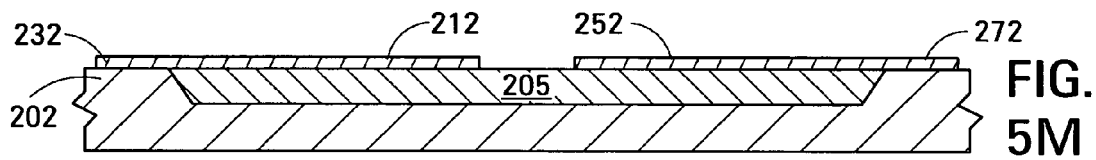

A layer of metal is deposited on the surface of the wafer and the fill material. The metal is patterned to define electrode 212, bonding pad 232, an electrical trace 233 extending between electrode 212 and bonding pad 232, electrode 252, bonding pad 272 and an electrical trace 273 extending between electrode 212 and bonding pad 272, as shown in FIGS. 5C and 5M. Electrode 212 and electrode 252 typically have an asymmetrical shape in a plane parallel to the major surface of the wafer. An asymmetrical shape minimizes lateral modes in FBAR 210 and FBAR 250 (FIG. 3A) of which the electrodes form part, as described in U.S. Pat. No. 6,215, 375 of Larson III et al., the disclosure of which is incorporated into this disclosure by reference. Electrode 212 and electrode 252 are located to expose part of the surface of fill material 205 so that the fill material can later be removed by etching, as will be described below.

The metal layers in which electrodes 212, 214, 222, 224, 252, 254, 262 and 264 are defined are patterned such that, in respective planes parallel to the major surface of the wafer, electrodes 212 and 214 of FBAR 210 have the same shape, size, orientation and position, electrodes 222 and 224 of FBAR 220 have the same shape, size, orientation and position, electrodes 252 and 254 of FBAR 250 have the same shape, size, orientation and position and electrodes 262 and 264 of FBAR 260 have the same shape, size, orientation and position. Typically, electrodes 214 and 222 additionally have the same shape, size, orientation and position and electrodes 254 and 262 additionally have the same shape, size, orientation and position.

In an embodiment, the metal deposited to form electrode 212, bonding pad 232, trace 233, electrode 252, bonding pad 272 and trace 273 was molybdenum. The molybdenum was deposited with a thickness of about 300 nm by sputtering, and was patterned by dry etching to define pentagonal electrodes each with an area of about 12,000 square μm. Other refractory metals such as tungsten, niobium and titanium may alternatively be used as the material of electrodes 212 and 252, bonding pads 232 and 272 and traces 233 and 273. The electrodes, bonding pads and traces may alternatively comprise layers of more than one material.

Figure 5D:
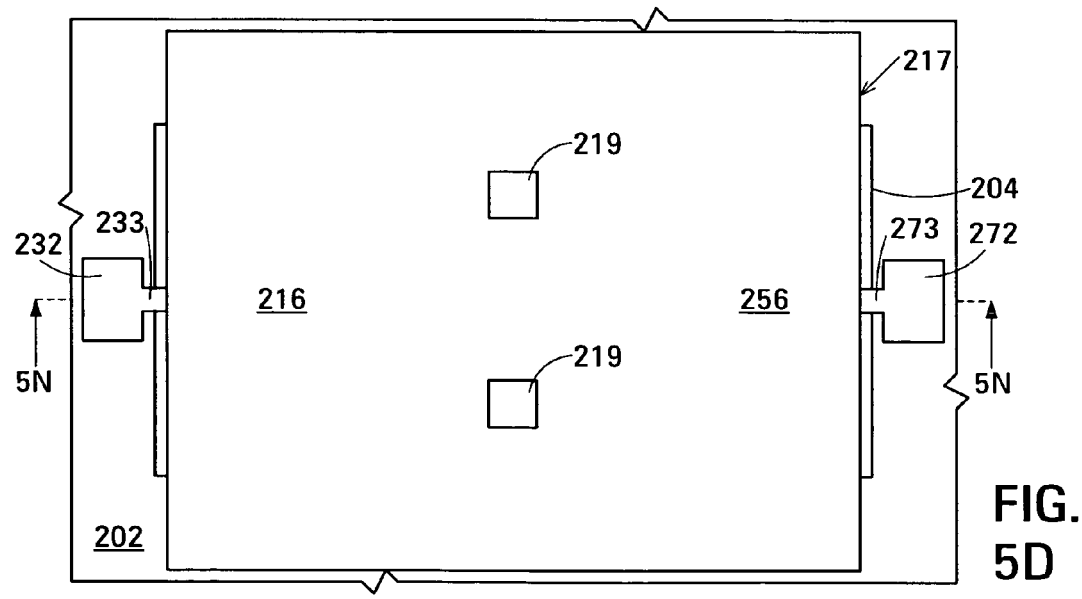
Figure 5N:
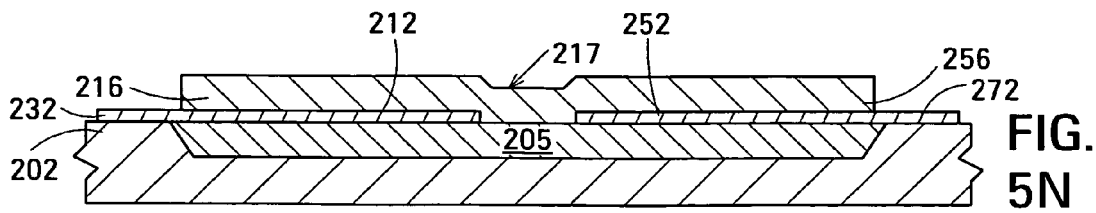

A layer of piezoelectric material is deposited and is patterned to define a piezoelectric layer 217 that provides piezoelectric layer 216 of FBAR 210 and piezoelectric layer 256 of FBAR 250, as shown in FIGS. 5D and 5N. Piezoelectric layer 217 is patterned to expose part of the surface of fill material 205 and bonding pads 232 and 272. Piezoelectric layer 217 is additionally patterned to define windows 219 that provide access to additional parts of the surface of the fill material.

In an embodiment, the piezoelectric material deposited to form piezoelectric layer 217 was aluminum nitride and was deposited with a thickness of about 1.4 μm by sputtering. The piezoelectric material was patterned by wet etching in potassium hydroxide or by chlorine-based dry etching. Alternative materials for piezoelectric layer 217 include zinc oxide and lead zirconium titanate.

Figure 5E:
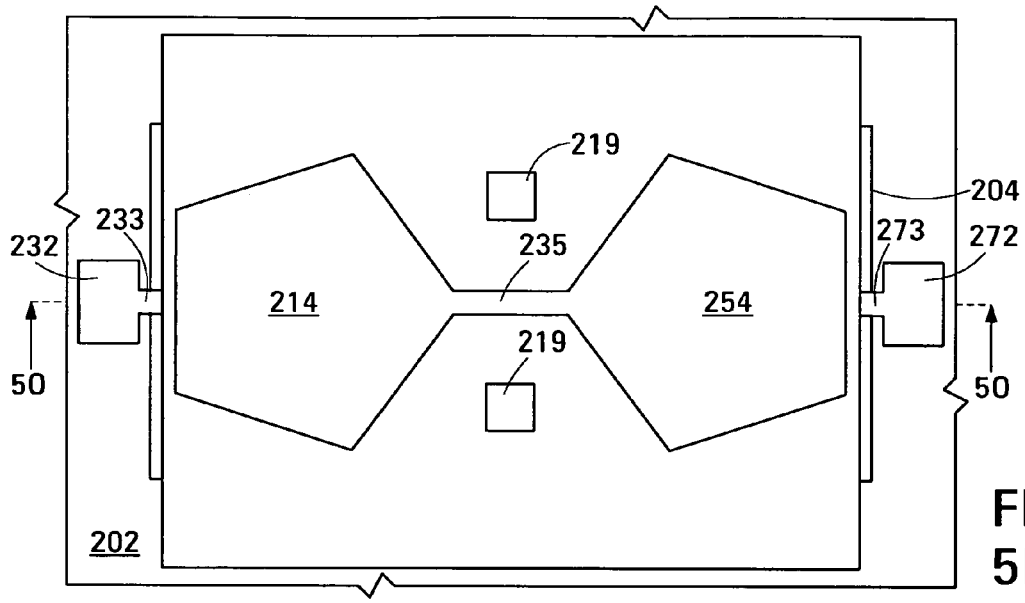
Figure 5O:
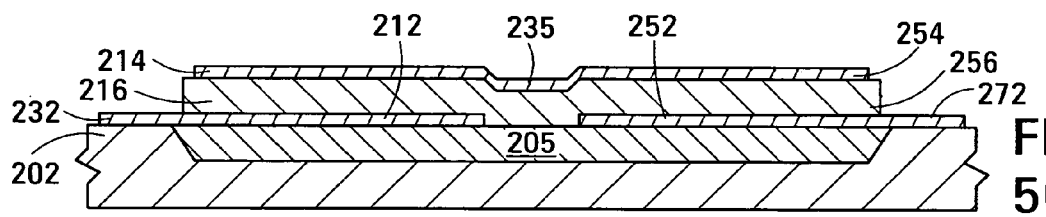

A layer of metal is deposited and is patterned to define electrode 214, electrode 254 and electrical trace 235 extending between electrode 214 and electrode 254, as shown in FIGS. 5E and 5O.

In an embodiment, the metal deposited to form electrode 214, electrode 254 and trace 235 was molybdenum. The molybdenum was deposited with a thickness of about 300 nm by sputtering, and was patterned by dry etching. Other refractory metals may alternatively be used as the material of electrodes 214 and 254 and trace 235. The electrodes and trace may alternatively comprise layers of more than one material.

Figure 5F:
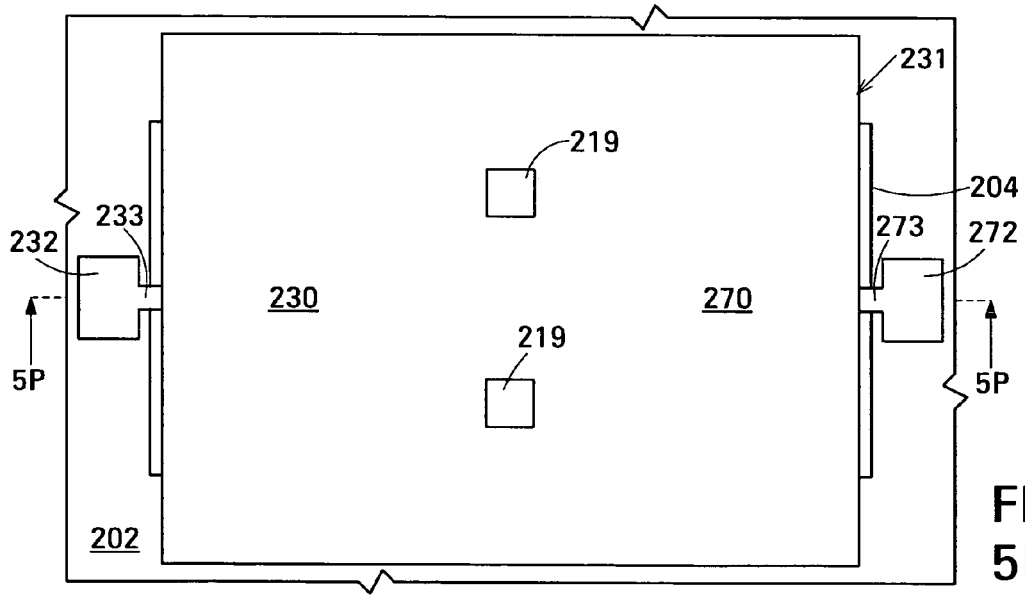
Figure 5P:
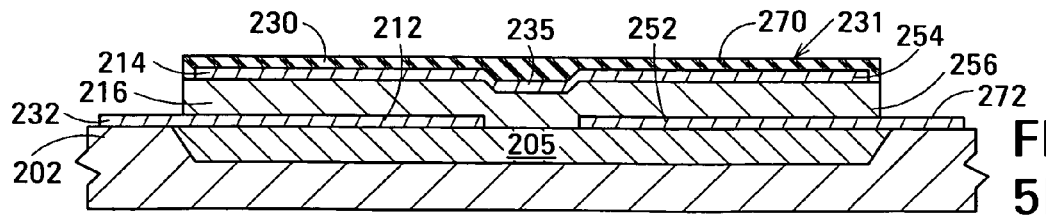

A layer of acoustic decoupling material is then deposited and is patterned to define an acoustic decoupling layer 231 that provides acoustic decoupler 230 and acoustic decoupler 270, as shown in FIGS. 5F and 5P. Acoustic decoupling layer 231 is shaped to cover at least electrode 214 and electrode 254, and is additionally shaped to expose part of the surface of fill material 205 and bonding pads 232 and 272. Acoustic decoupling layer 231 is additionally patterned to define windows 219 that provide access to additional parts of the surface of the fill material.

In an embodiment, the acoustic decoupling material was polyimide with a thickness of about 200 nm, i.e., one quarter of the center frequency wavelength in the polyimide. The polyimide was deposited to form acoustic decoupling layer 231 by spin coating, and was patterned by photolithography. Polyimide is photosensitive so that no photoresist is needed. As noted above, other plastic materials can be used as the acoustic decoupling material. The acoustic decoupling material can be deposited by methods other than spin coating.

In an embodiment in which the material of the acoustic decoupling layer 231 was polyimide, after deposition and patterning of the polyimide, the wafer was first baked at a temperature of about 250° C. in air and was then baked at a temperature of about 415° C. in an inert atmosphere, such as a nitrogen atmosphere, before further processing was performed. The bake evaporates volatile constituents of the polyimide and prevents the evaporation of such volatile constituents during subsequent processing from causing separation of subsequently-deposited layers.

Figure 5G:
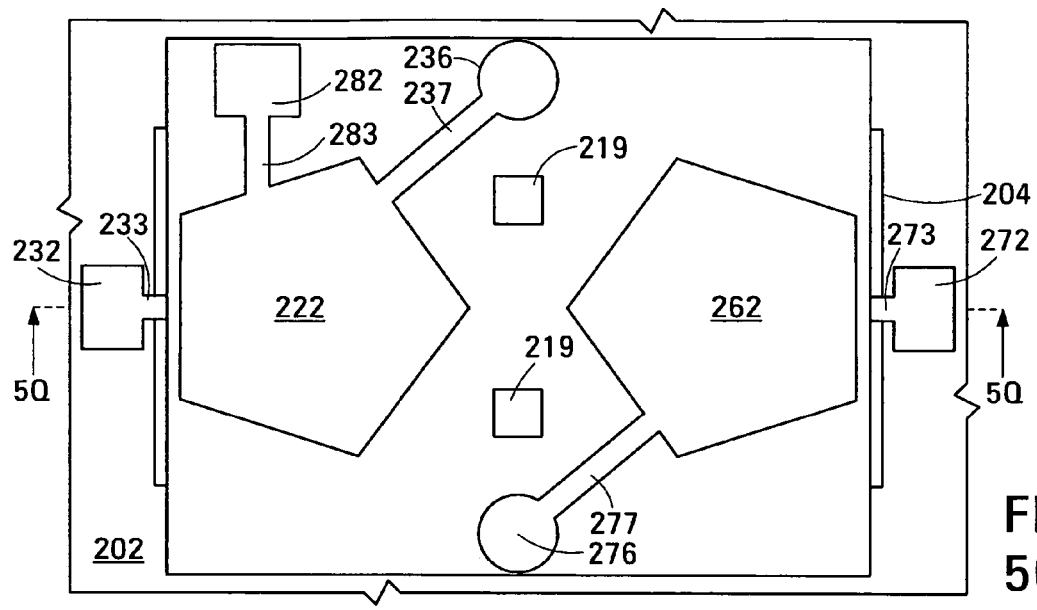
Figure 5Q:
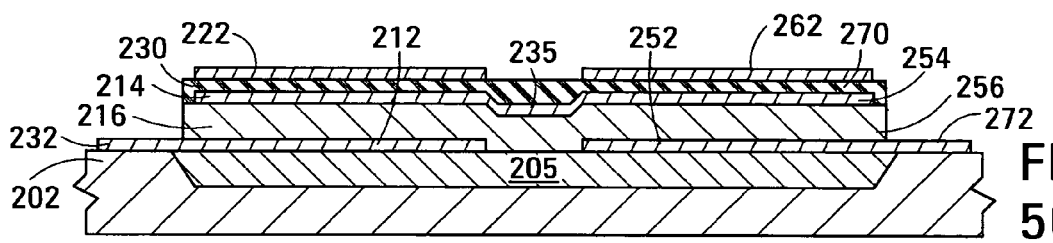

A layer of metal is deposited and is patterned to define electrode 222, interconnection pad 236, electrical trace 237 extending from electrode 222 to interconnection pad 236, bonding pad 282 and electrical trace 283 extending from electrode 222 to bonding pad 282, as shown in FIGS. 5G and 5Q. The patterning also defines in the layer of metal electrode 262, interconnection pad 276 and electrical trace 277 extending from electrode 262 to interconnection pad 276, also as shown in FIGS. 5G and 5Q.

In an embodiment, the metal deposited to form electrodes 222 and 262, bonding pad 282, interconnection pads 236 and 276 and electrical traces 237, 277 and 283 was molybdenum. The molybdenum was deposited with a thickness of about 300 nm by sputtering, and was patterned by dry etching. Other refractory metals may alternatively be used as the material of electrodes 222 and 262, pads 236, 276 and 282 and electrical traces 237, 277 and 283. The electrodes, bonding pads and traces may alternatively comprise layers of more than one material.

Figure 5H:
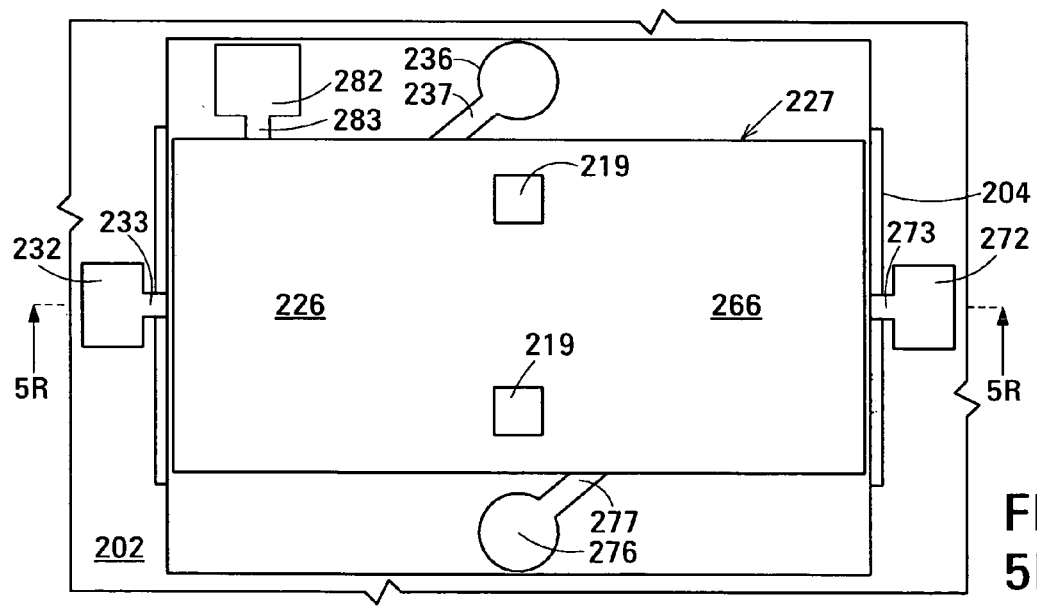
Figure 5R:
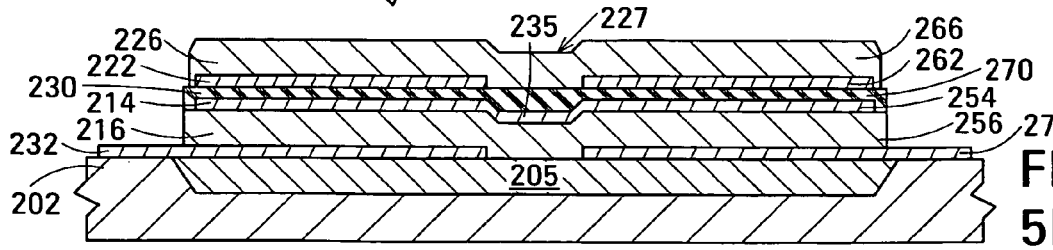

A layer of piezoelectric material is deposited and is patterned to define piezoelectric layer 227 that provides piezoelectric layer 226 of FBAR 220 and piezoelectric layer 266 of FBAR 260. Piezoelectric layer 227 is shaped to expose pads 232, 236, 272, 276 and 282 and to expose part of the surface of fill material 205 as shown in FIGS. 5H and 5R. Piezoelectric layer 227 is additionally patterned to define the windows 219 that provide access to additional parts of the surface of the fill material.

In an embodiment, the piezoelectric material deposited to form piezoelectric layer 227 was aluminum nitride and was deposited with a thickness of about 1.4 μm by sputtering. The piezoelectric material was patterned by wet etching in potassium hydroxide or by chlorine-based dry etching. Alternative materials for piezoelectric layer 227 include zinc oxide and lead zirconium titanate.

Figure 5I:
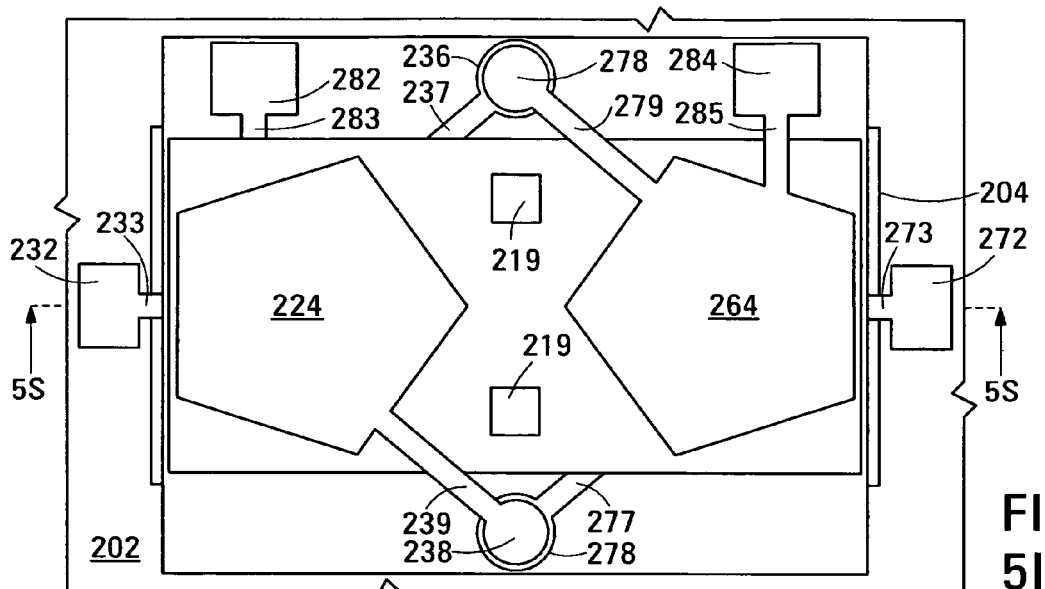
Figure 5S:
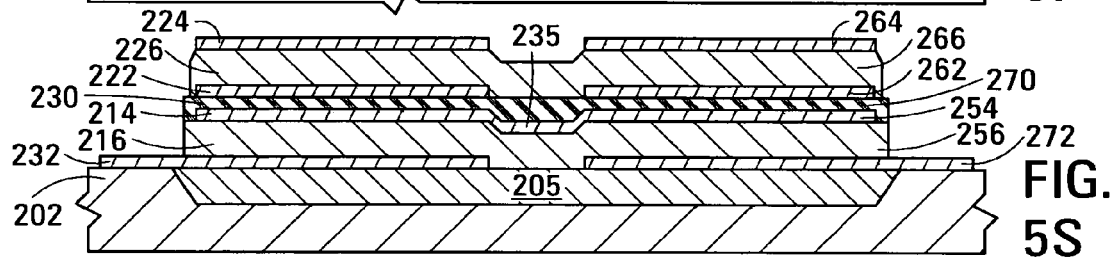

A layer of metal is deposited and is patterned to define electrode 224, interconnection pad 238 and electrical trace 239 extending from electrode 224 to interconnection pad 238, as shown in FIGS. 5I and 5S. Interconnection pad 238 is located in electrical contact with interconnection pad 276 to provide the part of electrical circuit 245 (FIG. 4C) that connects electrodes 224 and 262. The patterning also defines in the layer of metal electrode 264, interconnection pad 278, electrical trace 279 extending from electrode 264 to interconnection pad 278, bonding pad 284 and electrical trace 285 extending from electrode 264 to bonding pad 284, also as shown in FIGS. 5I and 5S. Interconnection pad 278 is located in electrical contact with interconnection pad 236 to provide the part of electrical circuit 245 (FIG. 4C) that connects electrodes 222 and 264. As noted above, bonding pads 282 and 284 and electrical traces 283 and 285 may be omitted if reliable electrical connections can be made to stacked interconnection pads 236 and 278 and to stacked interconnection pads 276 and 238.

In an embodiment, the metal deposited to form electrodes 224 and 264, pads 238, 278 and 284 and electrical traces 237, 279 and 285 was molybdenum. The molybdenum was deposited with a thickness of about 300 nm by sputtering, and was patterned by dry etching. Other refractory metals such may alternatively be used as the material of electrodes 224 and 264, pads 238, 278 and 284 and electrical traces 237, 279 and 285. The electrodes, pads and traces may alternatively comprise layers of more than one material.

Figure 5J:
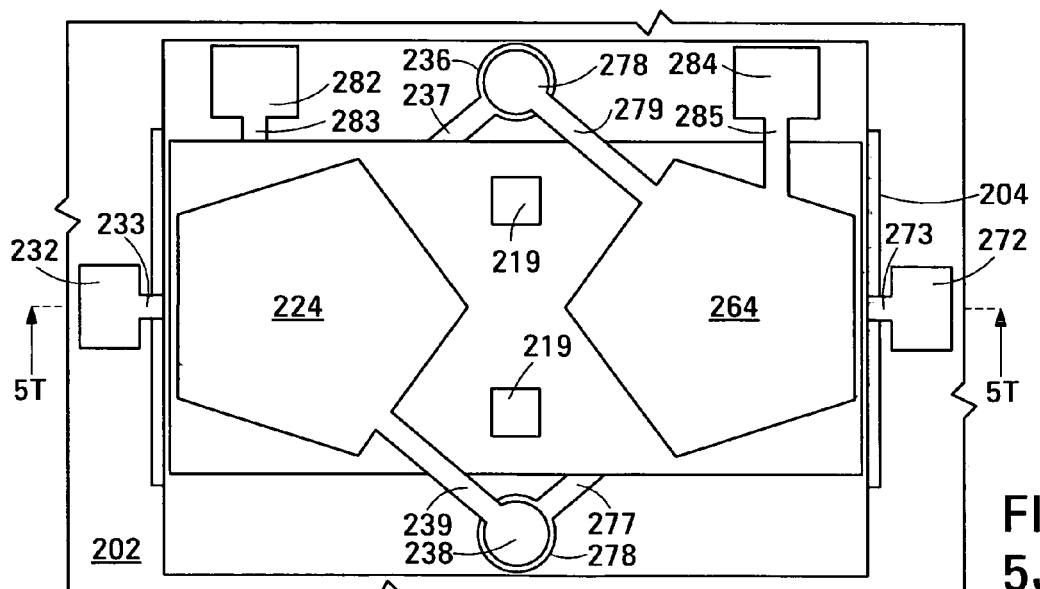
Figure 5T:
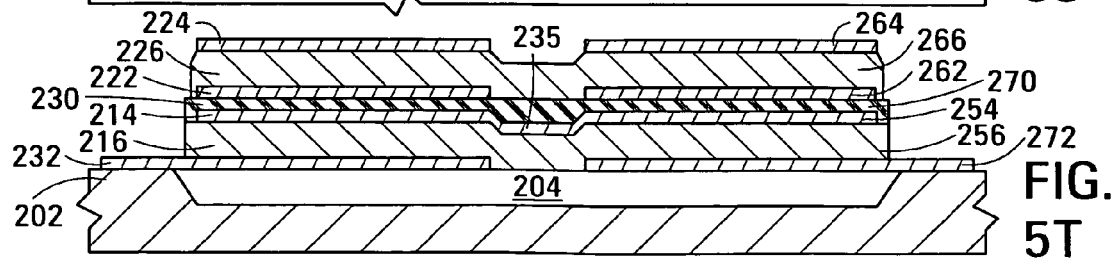

The wafer is then isotropically wet etched to remove fill material 205 from cavity 204. As noted above, portions of the surface of fill material 205 remain exposed through, for example, windows 219. The etch process leaves FACT 200 suspended over cavity 204, as shown in FIGS. 5J and 5T.

In an embodiment, the etchant used to remove fill material 205 was dilute hydrofluoric acid.

A gold protective layer is deposited on the exposed surfaces of pads 232, 238, 272, 278, 282 and 284.

The wafer is then divided into individual FACTs, including FACT 200. Each FACT is then mounted in a package and electrical connections are made between bonding pads 232, 272, 282 and 284 of the FACT and pads that are part of the package.

A process similar to that described may be used to fabricate embodiments of FACT 200 in which the FBARs are electrically connected as shown in FIGS. 4B-4H.

In use, bonding pad 282 electrically connected to electrodes 222 and 264 and bonding pad 284 electrically connected to electrodes 224 and 262 provide the first terminals of the FACT 200, and bonding pad 232 electrically connected to electrode 212 and bonding pad 272 electrically connected to electrode 252 provide the second terminals of FACT 200. In one embodiment, the first terminals provide the primary terminals and the second terminals provide the secondary terminals of FACT 200. In another embodiment, the first terminals provide the secondary terminals and the second terminals provide the primary terminals of FACT 200.

An embodiment of FACT 200 in which acoustic decoupler 130 incorporates a Bragg structure similar to that described above with reference to FIG. 1E is made by a process similar to that described above. The process differs as follows:

After a layer 217 of piezoelectric material is deposited and patterned (FIGS. 5D and 5N), a layer of metal is deposited and is patterned to define a high acoustic impedance Bragg element incorporating electrodes 214 and 254 and additionally to define electrical trace 235 extending between the electrodes, in a manner similar to that shown in FIGS. 5E and 5O. The high acoustic impedance Bragg element is similar to high acoustic impedance Bragg element 165 shown in FIG. 1E. The layer of metal is deposited with a nominal thickness equal to an odd, integral multiple of one quarter of the wavelength in the metal of an acoustic signal equal in frequency to the center frequency of the pass band of FACT 200.

In an embodiment, the metal deposited to form the high acoustic impedance Bragg element incorporating electrodes 214 and 254 is molybdenum. The molybdenum is deposited with a thickness of about 820 nm (one-quarter wavelength in Mo) by sputtering, and is patterned by dry etching. Other refractory metals may alternatively be used as the material of the high acoustic impedance Bragg element incorporating electrodes 214 and 254. The high acoustic impedance Bragg element may alternatively comprise layers of more than one metal.

A layer of low acoustic impedance material is then deposited and is patterned to define a low acoustic impedance Bragg element in a manner similar to that shown in FIGS. 5F and 5P. The layer of low acoustic impedance material is deposited with a nominal thickness equal to an odd, integral multiple of one quarter of the wavelength in the low acoustic impedance material of an acoustic signal equal in frequency to the center frequency of the pass band of FACT 200. The low acoustic impedance Bragg element is shaped to cover at least the high acoustic impedance Bragg element, and is additionally shaped to expose part of the surface of fill material 205 and bonding pads 232 and 272. The layer of low acoustic impedance material is additionally patterned to define windows that provide access to additional parts of the surface of the fill material.

In an embodiment, the low acoustic impedance material is $SiO_2$ with a thickness of about 790 nm. The $SiO_2$ is deposited by sputtering, and is patterned by etching. Other low acoustic impedance material that can be used as the material of low acoustic impedance Bragg element include phosphosilicate glass (PSG), titanium dioxide and magnesium fluoride. The low acoustic impedance material can alternatively be deposited by methods other than sputtering.

A layer of metal is deposited and is patterned to define a high acoustic impedance Bragg element incorporating electrodes 222 and 262. The layer of metal is additionally patterned to define an interconnection pad 236, an electrical trace 237 extending from electrode 222 to interconnection pad 236, a bonding pad 282, an electrical trace 283 extending from electrode 222 to bonding pad 282, an interconnection pad 276 and an electrical trace 277 extending from electrode 262 to interconnection pad 276 in a manner similar to that shown in FIGS. 7G and 7Q. The layer of metal is deposited with a nominal thickness equal to an odd, integral multiple of one quarter of the wavelength in the metal of an acoustic signal equal in frequency to the center frequency of the pass band of FACT 200.

In an embodiment, the metal deposited to form a high acoustic impedance Bragg element incorporating electrodes 222 and 262 is molybdenum. The molybdenum is deposited with a thickness of about 820 nm (one-quarter wavelength in Mo) by sputtering, and is patterned by dry etching. Other refractory metals may alternatively be used as the material of the high acoustic impedance Bragg element incorporating electrodes 222 and 262 and its associated pads and electrical traces. The high acoustic impedance Bragg element, pads and electrical traces may alternatively comprise layers of more than one material.

A layer of piezoelectric material is then deposited and is patterned to define piezoelectric layer 227, as described above, and the process continues as described above to complete fabrication of FACT 200.

In another embodiment, the acoustic decoupling material of layer 231 is a crosslinked polyphenylene polymer. After the layer of metal has been patterned to define electrodes 214 and 254 and electrical trace 235, as described above with reference to FIGS. 5E and 5O, the precursor solution for the crosslinked polyphenylene polymer is spun on in a manner similar to that described above with reference to FIG. 5F and 5P, but is not patterned. The formulation of the precursor solution and the spin speed are selected so that the crosslinked polyphenylene polymer forms a layer with a thickness of about 187 nm. This corresponds to one quarter of the wavelength $\lambda_n$ in the crosslinked polyphenylene polymer of an acoustic signal having a frequency equal to the center frequency of the pass band of FACT 200. The wafer is then baked at a temperature in the range from about 385° C. to about 450° C. in an inert ambient, such as under vacuum or in a nitrogen atmosphere, before further processing is performed. The bake first drives off the organic solvents from the precursor solution, and then causes the oligomer to cross link as described above to form the crosslinked polyphenylene polymer.

A layer of metal is then deposited on the layer of crosslinked polyphenylene polymer in a manner similar to that described above with reference to FIG. 5G and 5Q, but is initially patterned similarly to the patterning of acoustic decoupling layer 231 shown in FIG. 5F to define a hard mask that will later be used to pattern the layer of crosslinked polyphenylene polymer to define acoustic decoupling layer 231. The initially-patterned layer of metal has the same extent as acoustic decoupling layer 231, exposes bonding pads 232 and 272 and parts of the surface of fill material 205, and has windows in the intended locations of windows 219 in acoustic decoupling layer 231.

The layer of crosslinked polyphenylene polymer is then patterned as shown in FIG. 5F with the initially-patterned layer of metal as a hard etch mask. Patterning the layer of crosslinked polyphenylene polymer defines the extent of acoustic decoupling layer 231, which exposes bonding pads 232 and 272 and parts of the surface of fill material 205, and forms windows 219 that provide access to additional parts of the surface of the fill material. The patterning is performed with an oxygen plasma etch.

The layer of metal is then re-patterned as shown in FIGS. 5G and 5Q to define electrode 222, electrode 262, bonding pad 282, interconnection pads 236 and 276. The re-patterning additionally defines electrical trace 237 extending between electrode 222 and interconnection pad 236, electrical trace 277 extending between electrode 262 and interconnection pad 276 and electrical trace 283 extending between electrode 222 and bonding pad 282.

Fabrication of the embodiment of band-pass filter 200 with an acoustic decoupling layer of a crosslinked polyphenylene polymer as its acoustic decoupler is completed by performing the processing described above with reference to FIGS. 5H, 5I, 5J, 5R, 5S and 5T.

In an embodiment, the precursor solution for the crosslinked polyphenylene polymer was one sold by The Dow Chemical Company and designated SiLK™ J. Alternatively, the precursor solution may be any suitable one of the precursor solutions sold by The Dow Chemical Company under the trademark SiLK. In certain embodiments, a layer of an adhesion promoter was deposited before the precursor solution was spun on. Precursor solutions containing oligomers that, when cured, form a crosslinked polyphenylene polymer having an acoustic impedance of about 2 Mrayl may be available from other suppliers now or in the future and may also be used.

This disclosure describes the invention in detail using illustrative embodiments. However, the invention defined by the appended claims is not limited to the precise embodiments described.

We claim:

1. A film acoustically-coupled transformer (FACT), comprising:
    decoupled stacked bulk acoustic resonators (DSBARs), each comprising:
        a lower film bulk acoustic resonator (FBAR),
        an upper FBAR stacked on the lower FBAR, each of the FBARs comprising opposed planar electrodes arranged such that a pair of opposed planar electrodes of the lower FBARs are coupled to one another via a trace formed over a cavity, and
        a piezoelectric element between the electrodes, and between the lower and upper FBARs,
        an acoustic decoupler comprising a layer of acoustic decoupling material;
    first terminals electrically connected to the electrodes of the lower FBARs; and
    second terminals electrically connected to the electrodes of the upper FBARs.

2. The FACT of claim 1, in which the acoustic decoupling material is lower in acoustic impedance than the piezoelectric element.

3. The FACT of claim 2, in which the acoustic decoupling material is intermediate in acoustic impedance between the piezoelectric element and air.

4. The FACT of claim 2, in which the acoustic decoupling material has an acoustic impedance in the range from about 2 Mrayl to about 8 Mrayl.

5. The FACT of claim 2, in which the acoustic coupling material comprises polyphenylene.

6. The FACT of claim 2, in which the acoustic decoupling material comprises polyimide.

7. The FACT of claim 2, in which the acoustic decoupling material comprises poly(para-xylylene).

8. The FACT of claim 1, in which the acoustic decoupling material comprises crosslinked polyphenylene polymer formed from a precursor solution.

9. The FACT of claim 1, in which: the FACT has a pass band characterized by a center frequency; and the layer of acoustic decoupling material has a nominal thickness equal to an odd integral multiple of one quarter of the wavelength in the acoustic decoupling material of an acoustic signal equal in frequency to the center frequency.

10. The FACT of claim 9, in which odd integral multiple is unity.

11. A film acoustically-coupled transformer (FACT), comprising:
decoupled stacked bulk acoustic resonators (DSBARs), each of the DSBARs comprising:
a lower film bulk acoustic resonator (FBAR),
an upper FBAR stacked on the lower FBAR, each FBAR comprising opposed planar electrodes arranged such that a pair of opposed planar electrodes of the lower FBARs are coupled to one another via a trace formed over a filled cavity in a substrate, and
a piezoelectric element between the electrodes, and between the lower and upper FBARs,
an acoustic decoupler comprising a layer of acoustic decoupling material;
a first electrical circuit interconnecting the lower FBARs; and
a second electrical circuit interconnecting the upper FBARs.

12. The FACT of claim 11, in which:
the first electrical circuit interconnects the lower FBARs in one of (a) series and (b) anti-parallel; and
the second electrical circuit interconnects the upper FBARs in one of (c) series and (d) anti-parallel.

13. The FACT of claim 12, in which:
the FACT additionally comprises first terminals and second terminals;
the first electrical circuit additionally connects the lower FBARs to the first terminals; and
the second electrical circuit additionally connects the upper FBARs to the second terminals.

14. The FACT of claim 11, in which:
the first electrical circuit connects the lower FBARs in one of (a) parallel and (b) anti-series; and
the second electrical circuit connects the upper FBARs in one of (c) parallel and (d) anti-series.

15. The FACT of claim 11, in which the acoustic decoupling material comprises polyphenylene.

16. The FACT of claim 11, in which the acoustic decoupling material comprises polyimide.

17. The FACT of claim 11, in which the acoustic decoupling material comprises poly(para-xylylene).

18. The FACT of claim 11, in which the acoustic decoupling material comprises a crosslinked polyphenylene polymer.

19. The FACT of claim 18, in which the crosslinked polyphenylene polymer is formed from a precursor solution.

20. A film acoustically-coupled transformer (FACT), comprising:
decoupled stacked bulk acoustic resonators (DSBARs), comprising:
a lower film bulk acoustic resonator (FBAR),
an upper FBAR stacked on the lower FBAR, each of the FBARs comprising opposed planar electrodes arranged such that a pair of opposed planar electrodes of the lower FBARs are coupled to one another via a trace formed over a filled cavity in a substrate, and
a piezoelectric element between the electrodes, and between the lower and upper FBARs,
an acoustic decoupler comprising a layer of acoustic decoupling material having an acoustic impedance of about 2 Mrayl to about 8 Mrayl, the acoustic decoupler shaped to expose part of the surface of the fill material and patterned to provide access to additional parts of the surface of the fill material;
first terminals electrically connected to the electrodes of the lower FBARs via a first electrical circuit; and
second terminals electrically connected to the electrodes of the upper FBARs via a second electrical circuit.

21. The FACT of claim 20, wherein the first and second electrical circuits are configured to generate a 1:1 impedance transformation ratio.

22. The FACT of claim 20, wherein the first and second electrical circuits are configured to generate a 1:4 impedance transformation ratio.

23. The FACT of claim 20, wherein the first and second electrical circuits are configured to generate a 4:1 impedance transformation ratio.

* * * * *